(12) United States Patent
Ichiba

(10) Patent No.: US 10,754,817 B2
(45) Date of Patent: Aug. 25, 2020

(54) INFORMATION PROCESSING APPARATUS AND INFORMATION PROCESSING METHOD FOR PROCESS ORDER IN RECONFIGURABLE CIRCUIT

(71) Applicant: FUJITSU LIMITED, Kawasaki-shi, Kanagawa (JP)

(72) Inventor: Toshiyuki Ichiba, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 71 days.

(21) Appl. No.: 16/032,101

(22) Filed: Jul. 11, 2018

(65) Prior Publication Data

US 2019/0026247 A1 Jan. 24, 2019

(30) Foreign Application Priority Data

Jul. 18, 2017 (JP) .................................. 2017-139255

(51) Int. Cl.
*G06F 15/78* (2006.01)
*G06F 17/50* (2006.01)
(Continued)

(52) U.S. Cl.
CPC ...... *G06F 15/7878* (2013.01); *G06F 15/7867* (2013.01); *G06F 15/7871* (2013.01);
(Continued)

(58) Field of Classification Search
None
See application file for complete search history.

(56) References Cited

U.S. PATENT DOCUMENTS 6,172,520 B1 * 1/2001 Lawman ............. G06F 17/5054
326/38
6,347,346 B1 * 2/2002 Taylor ................ H03K 19/1776
710/22
(Continued)

FOREIGN PATENT DOCUMENTS

CN 105683939 A * 6/2016
CN 108572872 A * 9/2018
(Continued)

OTHER PUBLICATIONS

'A Hardware Operating System based Approach for Run-time Reconfigurable Platform of Embedded Devices' by Krishnamoorthy Baskaran and Thambipillai Srikanthan, In Proceedings of the Sixth Real-Time Linux Workshop, RTL Workshop 2004, (Singapore), Nov. 3-5, 2004. (Year: 2004).*
(Continued)

*Primary Examiner* — Steven G Snyder
(74) *Attorney, Agent, or Firm* — Fujitsu Patent Center

(57) ABSTRACT

An information processing apparatus having a reconfigurable circuit capable of rewriting a logic circuit includes, a process determination circuit that determines which of a plurality of processes is to be executed, a standby buffer circuit that holds process data to be used in a process waiting for execution among processes determined by the process determination circuit, and a rewrite control circuit that rewrites the current logic circuit written in the reconfigurable circuit to a logic circuit that executes one of the plurality of processes waiting for execution using each of a plurality of process data held in the standby buffer circuit when the amount of process data held in the standby buffer circuit exceeds a first predetermined amount.

9 Claims, 13 Drawing Sheets

(51) Int. Cl.
    *H03K 19/177*     (2020.01)
    *H03K 19/17736*     (2020.01)
    *H03K 19/17748*     (2020.01)
    *G06F 30/34*     (2020.01)

(52) U.S. Cl.
    CPC ......... *G06F 30/34* (2020.01); *H03K 19/1774* (2013.01); *H03K 19/17748* (2013.01)

(56) References Cited

U.S. PATENT DOCUMENTS

| | | | | |
|---|---|---|---|---|
| 7,199,608 | B1* | 4/2007 | Trimberger | H03K 19/17732 326/38 |
| 7,366,843 | B2* | 4/2008 | Cypher | G06F 12/0815 710/1 |
| 7,475,170 | B2* | 1/2009 | Inagaki | G06F 13/1673 710/52 |
| 7,954,114 | B2* | 5/2011 | Chamberlain | G06F 9/3879 326/39 |
| 8,745,564 | B2* | 6/2014 | Nomura | H04N 1/0097 716/117 |
| 9,038,072 | B2* | 5/2015 | Nollet | G06F 15/7867 713/100 |
| 10,262,098 | B1* | 4/2019 | Hamlet | G06F 30/34 |
| 10,402,219 | B2* | 9/2019 | Butcher | G06F 9/45558 |
| 10,678,584 | B2* | 6/2020 | Liu | G06F 9/45558 |
| 2004/0024925 | A1* | 2/2004 | Cypher | G06F 12/0815 710/1 |
| 2007/0083730 | A1* | 4/2007 | Vorbach | G06F 9/3897 712/10 |
| 2007/0174841 | A1* | 7/2007 | Chamberlain | G06F 9/3879 719/310 |
| 2009/0187756 | A1* | 7/2009 | Nollet | G06F 15/7867 713/100 |
| 2011/0238948 | A1* | 9/2011 | Vorbach | G06F 15/7867 712/15 |
| 2014/0325175 | A1* | 10/2014 | Vorbach | G06F 12/1433 711/164 |
| 2016/0202999 | A1* | 7/2016 | Van Den Heuvel | G06F 9/4411 713/100 |
| 2018/0225204 | A1* | 8/2018 | Choudhari | G06F 9/45545 |
| 2018/0357090 | A1* | 12/2018 | Butcher | G06F 9/45558 |
| 2019/0213029 | A1* | 7/2019 | Liu | G06F 9/45558 |

FOREIGN PATENT DOCUMENTS

| | | | |
|---|---|---|---|
| CN | 110231986 A | * | 9/2019 |
| JP | 2016-206729 | | 12/2016 |

OTHER PUBLICATIONS

'Scheduling and Communication-Aware Mapping of HW/SW Modules for Dynamically and Partially Reconfigurable SoC Architectures' by Sándor P. Fekete et al., in Proceedings of the 20th International Conference on Architecture of Computing Systems (ARCS '07), p. 9, Zurich, Switzerland, Mar. 2007. (Year: 2007).*

* cited by examiner

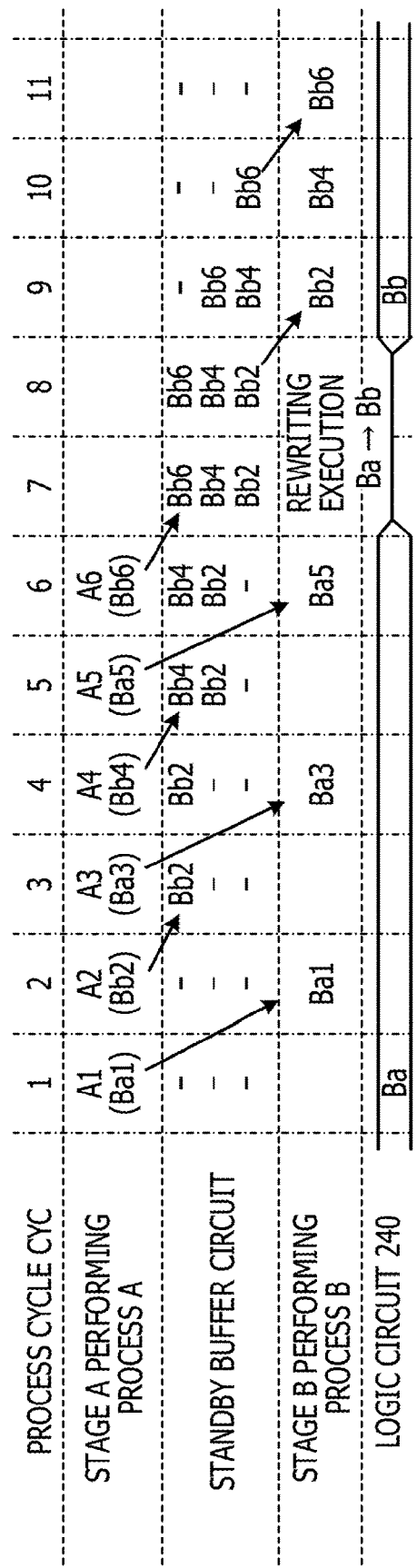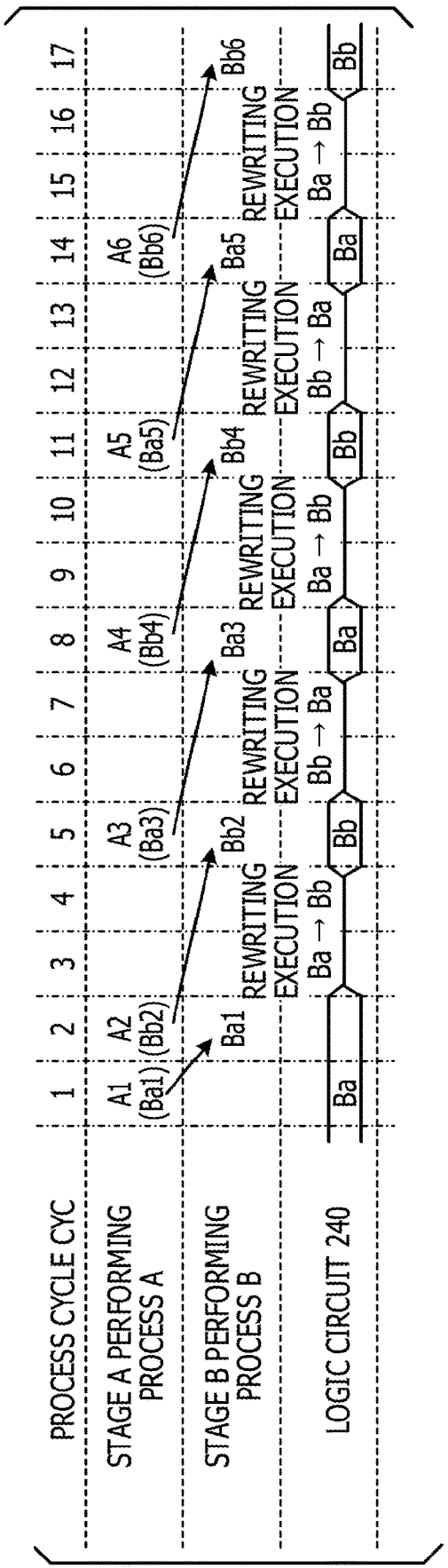

FIG. 8

| PROCESS CYCLE CYC | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| STAGE A | A1 | A2 | A3 | A4 | A5 | A6 | A7 | A8 | A9 | A10 | A11 | | | | | |
| PINFj | Ba | Ba | Ba | Bb | Ba | Ba | Ba | Ba | Ba | Ba | Ba | Z | Z | Z | Z | Z |
| PINFi | Ba | Ba | Ba | Ba | Ba | Ba | Ba | Ba | Ba | Ba | Ba | Ba | Bb | Bb | Bb | Bb |
| STANDBY BUFFER CIRCUIT | | | | | Bb,4 | Bb,4 | Bb,4 | Bb,4 | Bb,4 | Bb,4 | Bb,4 | | | | | |
| AFL1 | "0" | | | | | | | | | | | | | | | |
| PDIF | | | | | | | | | | | | | | | | |
| NOUT1 | | | | | | | | | | | | | | | | |
| COND1 | "0" | | | | | | | | | | | | | | | |
| COND2 | | | | | | | | | | | | | | | | |
| BUFIN | | | | | | | | | | | | | | | | |
| STAGE B | | Ba1 | Ba2 | Ba3 | | Ba5 | Ba6 | Ba7 | Ba8 | Ba9 | Ba10 | Ba11 | | DR | Bb4 | |
| STAGE C | | | C1 | C2 | C3 | C5 | C6 | C7 | C8 | C9 | C10 | C11 | | | | C4 |

INFORMATION PROCESSING APPARATUS AND INFORMATION PROCESSING METHOD FOR PROCESS ORDER IN RECONFIGURABLE CIRCUIT

CROSS-REFERENCE TO RELATED APPLICATION

This application is based upon and claims the benefit of priority of the prior Japanese Patent Application No. 2017-139255, filed on Jul. 18, 2017, the entire contents of which are incorporated herein by reference.

FIELD

The embodiments discussed herein are related to an information processing apparatus and an information processing method.

BACKGROUND

An information processing apparatus such as a server may have a reconfigurable circuit such as a field programmable gate array (FPGA) capable of rewriting a logic circuit. A logic circuit for executing a process is written in the FPGA, for example, at the time of starting up the information processing apparatus. In addition, the logic circuit written in the FPGA is reconfigured, for example, by dynamic reconfiguration in which the logic circuit is changed during the operation of the circuit.

For example, when an information processing apparatus having an FPGA sequentially executes jobs registered in a queue, when no logic circuit for executing the jobs is written in the FPGA, the information processing apparatus writes a logic circuit in the FPGA and uses the logic circuit written in the FPGA to execute the jobs. In this connection, there has been proposed an information processing apparatus that changes the processing order of jobs registered in a queue when at least one of an FPGA area where a logic circuit for executing the jobs is written and a memory area used for the jobs cannot be secured (see, e.g., Japanese Laid-Open Patent Publication No. 2016-206729).

For example, in the FPGA, the time required for rewriting the logic circuit is longer than the time taken for the logic circuit to execute a process. For this reason, when plural processes are executed while rewriting the logic circuit in the FPGA, the time taken from the start of the first process among the plural processes to the completion of the last process increases with the increase in the number of times of dynamic reconfiguration. That is, as the number of times of dynamic reconfiguration increases, the performance of the information processing apparatus is deteriorated.

Related techniques are disclosed in, for example, Japanese Laid-Open Patent Publication No. 2016-206729.

SUMMARY

According to an aspect of the embodiments, an information processing apparatus having a reconfigurable circuit capable of rewriting a logic circuit includes, a process determination circuit that determines which of a plurality of processes is to be executed, a standby buffer circuit that holds process data to be used in a process waiting for execution among processes determined by the process determination circuit, an input control circuit that stores new process data received from the process determination circuit in the standby buffer circuit when a logic circuit executing the process determined by the process determination circuit is not written in the reconfigurable circuit and keeps the process determined by the process determination circuit standby as the process waiting for execution, and a rewrite control circuit that rewrites the current logic circuit written in the reconfigurable circuit to a logic circuit that executes one of the plurality of processes waiting for execution using each of a plurality of process data held in the standby buffer circuit when the amount of process data held in the standby buffer circuit exceeds a first predetermined amount.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 2A is a view illustrating the outline of operation of the information processing apparatus illustrated in FIG. 1, and FIG. 2B is a view illustrating the outline of operation of a conventional information processing apparatus in which the input control circuit 220 and the standby buffer circuit 230 are omitted from the information processing apparatus 10;

FIG. 8 is a view illustrating an example of then operation of the information processing apparatus illustrated in FIG. 4;

DESCRIPTION OF EMBODIMENTS

Embodiments will be described below with reference to the drawings.

Figure 1:
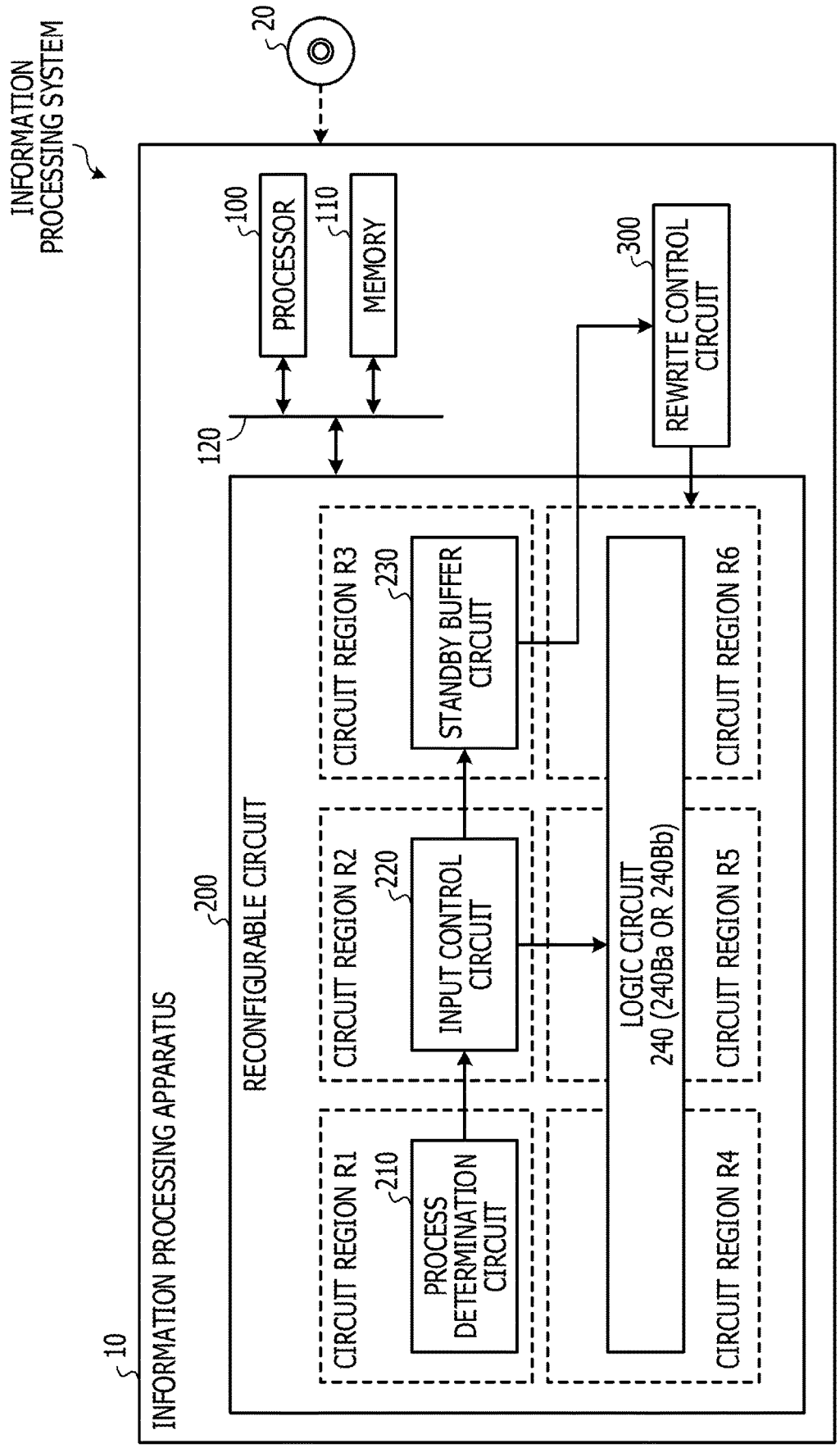
FIG. 1 is a block diagram illustrating an embodiment of an information processing apparatus, an information processing method and an information processing program.

FIG. 1 illustrates an embodiment of an information processing apparatus, an information processing method, and an information processing program. The information processing apparatus 10 illustrated in FIG. 1 is, for example, a server. For example, an information processing system includes an information processing apparatus 10 such as a server.

The information processing apparatus 10 includes, for example, a processor 100 such as a CPU (Central Processing Unit), a memory 110, a reconfigurable circuit 200, and a rewrite control circuit 300. The processor 100, the memory 110 and the reconfigurable circuit 200 are connected to a bus 120. Then, the information processing apparatus 10 uses the reconfigurable circuit 200 to execute pipeline processing using a pipeline including a plurality of stages.

For example, the processor 100 executes an information processing program stored in the memory 110 to control the operation of the information processing apparatus 10. The information processing program may be stored in a storage device other than the memory 110 in a storage device of the information processing apparatus 10 or may be stored in a storage device outside the information processing apparatus 10. The information processing program may be stored in a computer-readable recording medium 20 such as a CD-ROM (Compact Disc Read Only Memory), a DVD (Digital Versatile Disc) or a USB (Universal Serial Bus) memory. In this case, the information processing program stored in the recording medium 20 is transferred from the recording medium 20 to, for example, the memory 110 via an input/output interface (not illustrated) installed in the information processing apparatus 10. The information processing program may be also transferred from the recording medium 20 to a hard disk (not illustrated) and then transferred from the hard disk to the memory 110.

The reconfigurable circuit 200 is, for example, an FPGA capable of rewriting a logic circuit dynamically. For example, the reconfigurable circuit 200 has plural circuit regions R (R1, R2, R3, R4, R5, and R6) in which the logic circuit can be rewritten. The number of circuit regions R is not limited to six.

The logic circuit of each circuit region R is rewritten by the rewrite control circuit 300. In the example illustrated in FIG. 1, the rewrite control circuit 300 writes logic circuits functioning as a process determination circuit 210, an input control circuit 220, and a standby buffer circuit 230, in the respective circuit regions R1, R2, and R3. Thus, the reconfigurable circuit 200 has the process determination circuit 210, the input control circuit 220, and the standby buffer circuit 230. In addition, the rewrite control circuit 300 writes a logic circuit 240 in a circuit region group including the circuit regions R4, R5, and R6. The logic circuit 240 is a logic circuit to be reconfigured by dynamic reconfiguration of changing a logic circuit in a circuit region R not operating during the operation of other logic circuits in the reconfigurable circuit 200. In the example illustrated in FIG. 1, the logic circuit 240 is reconfigured as one of a logic circuit 240Ba for executing a process Ba illustrated in FIG. 2 and a logic circuit 240Bb for executing a process Bb illustrated in FIG. 2. The number of logic circuits 240B to be reconfigured is not limited to two.

The process determination circuit 210 determines which of plural processes (e.g., the processes Ba and Bb illustrated in FIG. 2) is to be executed. Then, the process determination circuit 210 outputs the process data used in the determined process to the input control circuit 220. When the logic circuit 240 that executes the process determined by the process determination circuit 210 is not written in the reconfigurable circuit 200, the input control circuit 220 stores new process data received from the process determination circuit 210 in the standby buffer circuit 230. According to this, the process determined by the process determination circuit 210 stands by as a process waiting for execution. That is, the standby buffer circuit 230 holds process data to be used in a process waiting for execution out of processes determined by the process determination circuit 210.

The configuration of the information processing apparatus 10 is not limited to the example illustrated in FIG. 1. For example, circuits (e.g., a logic circuit using the result of process of the logic circuit 240) other than the process determination circuit 210, the input control circuit 220, the standby buffer circuit 230, and the logic circuit 240 may be further written in the reconfigurable circuit 200.

FIG. 2A illustrates the outline of operation of the information processing apparatus 10 illustrated in FIG. 1. FIG. 2B illustrates the outline of operation of a conventional information processing apparatus in which the input control circuit 220 and the standby buffer circuit 230 are omitted from the information processing apparatus 10.

In the operation illustrated in FIG. 2A, the reconfigurable circuit 200 executes a pipeline process by a pipeline having a stage A for executing the process A and a stage B for executing the process B. The process A is a process of determining which of plurality of processes B (Ba and Bb) is to be executed. In FIG. 2A, numerals (1, 2, 3, 4, 5, and 6) are added to the tail of symbol in order to distinguish the process A executed plural times. Similarly, numerals (1, 3, and 5) are added to the tail of symbol in order to distinguish the process Ba executed plural times and numerals (2, 4, and 6) are added to the tail of symbol in order to distinguish the process Bb executed plural times. The numerals at the tail of symbol of the processes A, Ba, and Bb indicate the order of input to the pipeline.

In a process cycle CYC1, the process determination circuit 210 determines a process Ba1 of the plural processes B (Ba and Bb) as a process B to be executed in the B stage, and outputs process data to be used in the process Ba1 to the input control circuit 220. According to this, the input control circuit 220 receives the process data to be used in the process Ba1 from the process determination circuit 210 as new process data.

In FIG. 2A, the logic circuit 240 is configured as the logic circuit 240Ba executes the process Ba, of the logic circuits 240Ba and 240Bb, before the process cycle CYC1 starts. In the example illustrated in FIG. 1, the logic circuit 240Ba is written in the circuit region group including the circuit regions R4, R5, and R6. In this case, there is an insufficient space of the circuit region R for writing the logic circuit 240Bb. Therefore, one of the logic circuits 240Ba and 240Bb is written in the reconfigurable circuit 200.

In a process cycle CYC2, the input control circuit 220 causes the current logic circuit 240Ba written in the reconfigurable circuit 200 to execute the process Ba1 determined by the process determination circuit 210. For example, the input control circuit 220 transfers the new process data (the process data to be used in the process Ba1), which is received from the process determination circuit 210, to the current logic circuit 240Ba, and causes the current logic circuit 240Ba to execute the process Ba1. In addition, in the process cycle CYC2, the process determination circuit 210 determines the process Bb2 of the plural processes B (Ba and Bb) as a process B to be executed in the B stage, and outputs process data to be used in the process Bb2 to the input control circuit 220.

In a process cycle CYC3, the current logic circuit 240Ba written in the reconfigurable circuit 200 is different from the logic circuit 240Bb which executes the process Bb2 determined by the process determination circuit 210. Therefore, the input control circuit 220 stores the new process data (the process data to be used in the process Bb2) received from the process determination circuit 210 in the standby buffer circuit 230 and keeps the execution of the process Bb2 standby. Therefore, in the process cycle CYC3, the logic circuit 240Ba does not execute the process Bb2.

In this way, when the logic circuit 240Bb executing the process Bb2 determined by the process determination circuit 210 is not written in the reconfigurable circuit 200, the input control circuit 220 stores the new process data received from the process determination circuit 210 in the standby buffer circuit 230. Then, the input control circuit 220 causes the process Bb2 determined by the process determination circuit 210 to stand by as a process Bb2 waiting for execution.

Here, in the example illustrated in FIG. 2A, the size of storage area of the standby buffer circuit 230 is a size for storing three process data. In this case, for example, a first decision value used for deciding whether or not there is a space for storing new process data in the standby buffer circuit 230 is preset to a number "2" smaller by one than the number "3" of process data that can be held by the standby buffer circuit 230. In the process cycle CYC3, the standby buffer circuit 230 holds one process data to be used in the process Bb2. That is, the number of process data held in the standby buffer circuit 230 is less than the first decision value "2." Accordingly, the standby buffer circuit 230 has a space for storing the new process data. Therefore, the rewriting of the logic circuit 240 is not executed.

In addition, in the process cycle CYC3, the process determination circuit 210 determines the process Ba3 of the plural processes B (Ba and Bb) as a process B to be executed in the B stage, and outputs process data to be used in the process Ba3 to the input control circuit 220.

In a process cycle CYC4, the input control circuit 220 and the process determination circuit 210 execute the same operation as the process cycle CYC2. For example, the input control circuit 220 causes the current logic circuit 240Ba to execute the process Ba3 determined by the process determination circuit 210. In addition, the process determination circuit 210 determines the process Bb4 of the plural processes B (Ba and Bb) as a process B to be executed in the B stage, and outputs the process data to be used in the process Bb4 to the input control circuit 220.

In a process cycle CYC5, the input control circuit 220 and the process determination circuit 210 execute the same operation as the process cycle CYC3. For example, the input control circuit 220 stores the new process data (the process data to be used in the process Bb4) received from the process determination circuit 210 in the standby buffer circuit 230 and keeps the execution of the process Bb4 standby. According to this, the standby buffer circuit 230 holds the process data to be used in the process Bb4 and the process data to be used in the process Bb1.

In addition, the process determination circuit 210 determines the process Ba5 of the plural processes B (Ba and Bb) as a process B to be executed in the B stage and outputs the process data to be used in the process Ba5 to the input control circuit 220. Since the process Ba5 is executed in the next process cycle CYC6, the number of process data retained in the standby buffer circuit 230 is maintained at the same number as the first decision value "2" in the process cycle CYC6 and does not exceed the first decision value. Therefore, the rewriting of the logic circuit 240 is not executed. The sum of amounts of process data of the same number as the first decision value corresponds to, for example, a first predetermined amount.

In a process cycle CYC6, the input control circuit 220 and the process determination circuit 210 execute the same operation as the process cycle CYC4. For example, the input control circuit 220 causes the current logic circuit 240Ba to execute the process Ba5 determined by the process determination circuit 210.

In addition, the process determination circuit 210 determines the process Bb6 of the plural processes B (Ba and Bb) as a process B to be executed in the B stage and outputs the process data used in the process Bb 6 to the input control circuit 220. Since the process Bb6 is not executed in the next process cycle CYC7, the process data used in the process Bb6 is stored in the standby buffer circuit 230 in the process cycle CYC7. Therefore, the rewrite control circuit 300 decides that the number of process data held in the standby buffer circuit 230 exceeds the first decision value "2" in the process cycle CYC7. That is, the rewrite control circuit 300 decides that the amount of process data held in the standby buffer circuit 230 exceeds the first predetermined amount. Then, the rewrite control circuit 300 starts from the process cycle CYC7 a process of rewriting the logic circuit 240Ba to the logic circuit 240Bb that executes the respective processes Bb2, Bb4, and Bb6 waiting for execution.

In the process cycle CYC7, the input control circuit 220 stores the new process data (the process data to be used in the process Bb 6) received from the process determination circuit 210 in the standby buffer circuit 230 and keeps the execution of the process Bb6 standby. According to this, the standby buffer circuit 230 holds three process data to be respectively used in the processes Bb2, Bb4, and Bb6. In addition, as described above, the rewrite control circuit 300 starts the process of rewriting the logic circuit 240Ba to the logic circuit 240Bb that executes the respective processes Bb2, Bb4, and Bb6 waiting for execution.

In this way, when the amount of process data held in the standby buffer circuit 230 exceeds the first predetermined amount, the rewrite control circuit 300 rewrites the current logic circuit 240 written in the reconfigurable circuit 200. For example, the rewrite control circuit 300 rewrites the current logic circuit 240Ba to the logic circuit 240Bb that executes one of the plural execution waiting processes Bb2, Bb4, and Bb6 using the plural process data held in the standby buffer circuit 230.

In a process cycle CYC8, the rewrite control circuit 300 continues the process of rewriting the logic circuit 240Ba to the logic circuit 240Bb. In the example illustrated in FIG. 2, the number of process cycles CYC required for reconfiguration of the logic circuit 240 is two (e.g., two process cycles CYC7 and CYC8). However, the number of process cycles CYC required for reconfiguration of the logic circuit 240 is not limited to two.

In a process cycle CYC9, the current logic circuit 240 written in the reconfigurable circuit 200 is the logic circuit 240Bb that executes the respective processes Bb2, Bb4, and Bb6. Therefore, the input control circuit 220 causes the current logic circuit 240Bb to execute the process Bb2, which has the longest standby time after being determined as the process B to be executed in the B stage, among the processes Bb2, Bb4, and Bb6 waiting for execution. For example, the input control circuit 220 transfers the process data to be used in the process Bb2 from the standby buffer circuit 230 to the current logic circuit 240Bb and causes the current logic circuit 240Bb to execute the process Bb2. According to this, the process data to be used in the process Bb2 is deleted from the standby buffer circuit 230.

In a process cycle CYC10, the input control circuit 220 causes the current logic circuit 240Bb to execute the process Bb4, which has the longest standby time after being determined as the process B to be executed in the B stage, of the processes Bb4 and Bb6 waiting for execution. For example, the input control circuit 220 transfers the process data to be used in the process Bb4 from the standby buffer circuit 230 to the current logic circuit 240Bb and causes the current logic circuit 240Bb to execute the process Bb4. According to this, the process data to be used in the process Bb4 is deleted from the standby buffer circuit 230.

In a process cycle CYC11, the input control circuit 220 causes the current logic circuit 240Bb to execute the process Bb6 waiting for execution. For example, the input control circuit 220 transfers the process data to be used in the process Bb6 from the standby buffer circuit 230 to the current logic circuit 240Bb and causes the current logic circuit 240Bb to execute the process Bb6. According to this, the process data held in the standby buffer circuit 230 disappears and the operation of the information processing apparatus 10 when the process A is executed six times is ended. In this way, in the operation illustrated in FIG. 2A, the number of process cycles CYC required from the execution of the first process A1 to the completion of the process Bb6 determined in the last process A6 is 11.

Here, for example, in the conventional information processing apparatus in which the input control circuit 220 and the standby buffer circuit 230 are omitted from the information processing apparatus 10, the process Ba and the process Bb are alternately executed as illustrated in FIG. 2B. Therefore, whenever each of the process Ba1, Bb1, Ba3, Bb4, and Ba5 is completed, the rewriting of the logic circuit 240 occurs. In this case, the number of times of dynamic reconfiguration (the number of times of rewriting of the logic circuit 240) is five, which is larger by four than that of the information processing apparatus 10. When the rewriting of the logic circuit 240 is executed five times, the number of process cycles CYC required from the execution of the first process A1 to the completion of the process Bb6 determined in the last process A6 is 17, which is larger by 6 than that of the information processing apparatus 10.

In contrast, the information processing apparatus 10 does not rewrite the logic circuit 240 every time the input control circuit 220 receives the process data to be used in the process B that cannot be executed by the current logic circuit 240. That is, the information processing apparatus 10 does not rewrite the logic circuit 240 every time the process B that cannot be executed by the current logic circuit 240 is determined as a process B to be executed in the B stage. Therefore, in the information processing apparatus 10, it is possible to suppress an increase in the number of times of dynamic reconfiguration when executing the plural processes Ba and Bb, as compared with the conventional case. As a result, in the information processing apparatus 10, it is possible to suppress an increase in the number of process cycles CYC required to execute the plural processes B, as compared with the conventional case.

In addition, the processes executed by the reconfigurable circuit 200 are not limited to pipeline processing. In the example illustrated in FIG. 2A, the rewrite control circuit 300 determines execution of rewriting of the logic circuit 240 in the process cycle CYC 6, but may determine the execution of rewriting of the logic circuit 240 during the process cycle CYC7. For example, in each process cycle CYC, the rewrite control circuit 300 may refer to the number of process data held in the standby buffer circuit 230 at a timing later than the timing at which the process data is stored in the standby buffer circuit 230 and the timing at which the process B is started. Then, the rewrite control circuit 300 determines whether or not the number of process data held in the standby buffer circuit 230 exceeds the first decision value. When the number of process data held in the standby buffer circuit 230 exceeds the first decision value, the rewrite control circuit 300 may execute the rewriting of the logic circuit 240.

Figure 3:
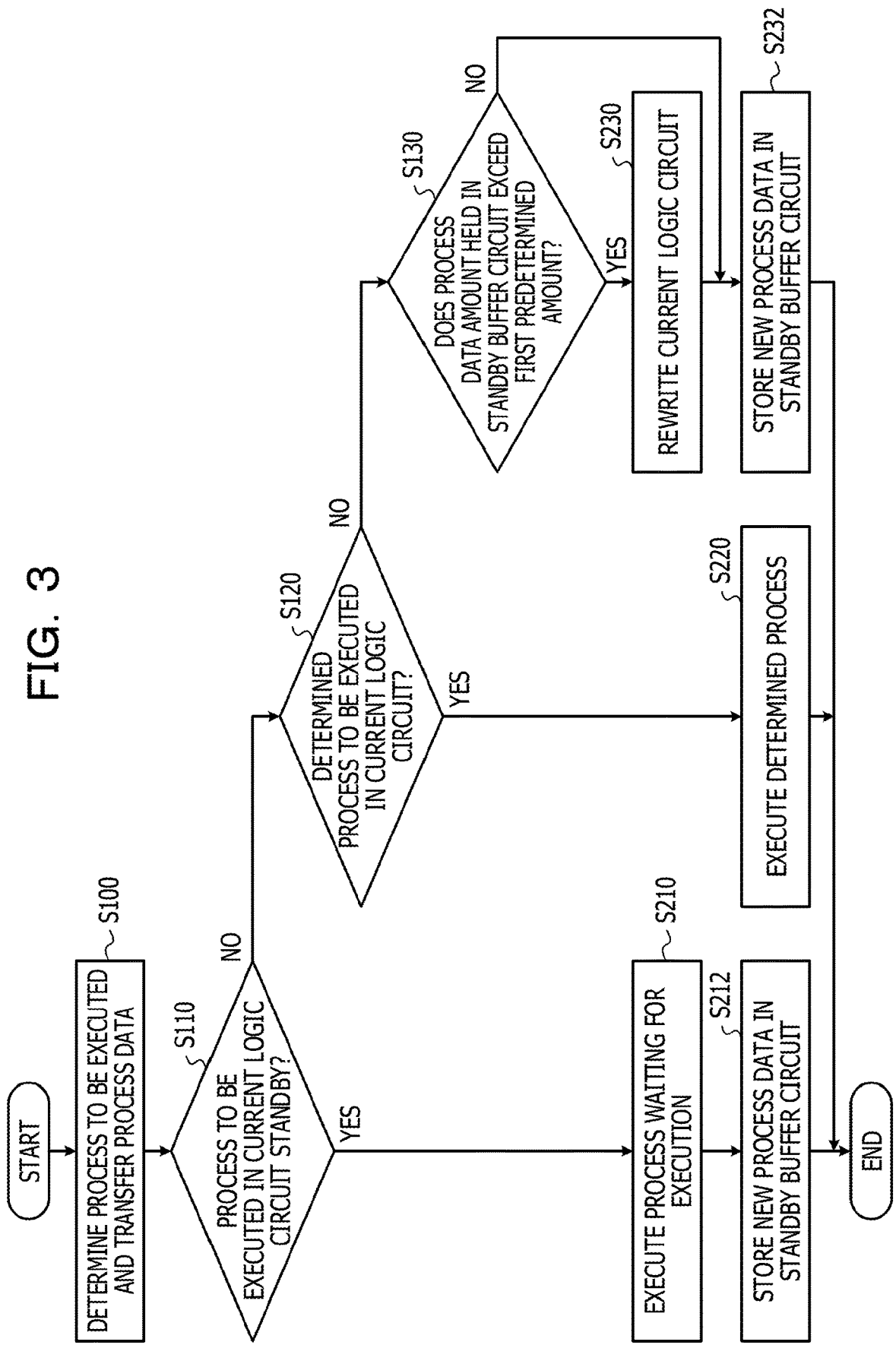
FIG. 3 is a view illustrating an example of the operation of the information processing apparatus illustrated in FIG. 1.

FIG. 3 illustrates an example of the operation of the information processing apparatus 10 illustrated in FIG. 1. The operation illustrated in FIG. 3 is one mode of an information processing method by an information processing apparatus having a reconfigurable circuit capable of rewriting a logic circuit and an information processing program for controlling the operation of the information processing apparatus. In addition, the operation illustrated in FIG. 3 is the operation of the information processing apparatus 10 when the process A is input to the A stage. For example, steps S110, S120, and S130 are executed in a process cycle CYC in which step S100 has been already executed. Further, steps S210, S212, S220, S230, and S232 are executed in a process cycle CYC next to the process cycle CYC in which step S100 has been already executed.

In step S100, the process determination circuit 210 determines a process B to be executed in the B stage, among the plural processes B, and transfers the process data to be used in the determined process B to the input control circuit 220.

Next, in step S110, the input control circuit 220 determines whether or not the process B to be executed in the current logic circuit 240 written in the reconfigurable circuit 200 is in a standby state. For example, the input control circuit 220 determines whether or not the process data to be used in the process B that can be executed in the current logic circuit 240 is held in the standby buffer circuit 230. When it is determined that the process B to be executed in the current logic circuit 240 is in a standby state, the operation of the information processing apparatus 10 proceeds to step S210. Meanwhile, when it is determined that the process B to be executed by the current logic circuit 240 is not in a standby state, the operation of the information processing apparatus 10 proceeds to step S120.

In step S120, the input control circuit 220 determines whether or not the process B determined by the process determination circuit 210 (the process B determined in step S100) is a process B to be executed in the current logic circuit 240. When it is determined that the process B determined by the process determination circuit 210 is a process B to be executed in the current logic circuit 240, the operation of the information processing apparatus 10 proceeds to step S220. Meanwhile, when it is determined that the process B determined by the process determination circuit 210 is not a process B to be executed in the current logic circuit 240, the operation of the information processing apparatus 10 proceeds to step S130.

In step S130, the rewrite control circuit 300 determines whether or not the amount of process data held in the standby buffer circuit 230 exceeds the first predetermined amount. For example, when the number of process data held in the standby buffer circuit 230 at the time of start of step S130 is equal to the first decision value, the rewrite control circuit 300 determines that the number of process data held in the standby buffer circuit 230 exceeds the first decision value in the next process cycle CYC. As described with reference to FIG. 2, the first decision value is the number of process data corresponding to the first predetermined amount. When it is determined that the amount of process data held in the standby buffer circuit 230 exceeds the first predetermined amount, the operation of the information processing apparatus 10 proceeds to step S230. Meanwhile, when it is determined that the amount of process data held in the standby buffer circuit 230 does not exceed the first predetermined amount, the operation of the information processing apparatus 10 proceeds to step S232.

In step S210, the current logic circuit 240 executes the process B waiting for execution that can be executed in the current logic circuit 240. For example, the input control circuit 220 transfers the process data to be used in the process B that can be executed in the current logic circuit 240, among the process data held in the standby buffer circuit 230, to the current logic circuit 240, and causes the current logic circuit 240 to execute the process B waiting for execution.

Next, in step S212, the input control circuit 220 stores new process data (process data to be used in the process B determined in step S100) received from the process determination circuit 210 in the standby buffer circuit 230.

In step S220, the current logic circuit 240 executes the process B determined by the process determination circuit 210 (the process B determined in step S100). For example, the input control circuit 220 transfers the new process data received from the process determination circuit 210 to the current logic circuit 240, and causes the current logic circuit 240 to execute the process B using the new process data.

In step S230, the rewrite control circuit 300 rewrites the current logic circuit 240 written in the reconfigurable circuit 200 to the logic circuit 240 that executes one of the plural execution waiting processes B. For example, the rewrite control circuit 300 specifies a process B having the longest standby time after being determined as a process B to be executed in the B stage, among the plural process waiting processes B, and rewrites the current logic circuit 240 to the logic circuit 240 that executes the specified process B.

Next, in step S232, similarly to step S212, the input control circuit 220 transfers the new process data (the process data to be used in the process B determined in step S100) received from the process determination circuit 210 to the standby buffer circuit 230.

The operation of the information processing apparatus 10 is not limited to the example illustrated in FIG. 3. For example, the order of start of steps S210 and S212 may be reverse to the order illustrated in FIG. 3. Further, for example, steps S210 and S212 may be executed in parallel.

In addition, for example, in the operation of the information processing apparatus 10 after all the processes A are input to the stage A, steps S100, S120, S212, S130, S220, and S232 are omitted from the operations illustrated in FIG. 3. For example, when the process B to be executed in the current logic circuit 240 is in a standby state, step S210 is executed. When the process B to be executed in the current logic circuit 240 is not in a standby state, step S230 is executed.

As described above, in the embodiment illustrated in FIGS. 1 to 3, the number of times of rewriting of the logic circuit 240 can be reduced as compared with a case where the logic circuit 240 is rewritten every time the process B that cannot be executed in the current logic circuit 240 is determined as a process B to be executed in the B stage. That is, it is possible to suppress an increase in the number of times of dynamic reconfiguration at the time of executing the plural processes B in the reconfigurable circuit 200 that can rewrite the logic circuit.

Thus, the performance of the information processing apparatus 10 can be improved. In particular, when the time required for rewriting of the logic circuit 240 is longer than the time for which the logic circuit 240 executes the process B, the effect of improving the performance of the information processing apparatus 10 by reducing the number of times of rewriting of the logic circuit 240 is growing.

Figure 4:
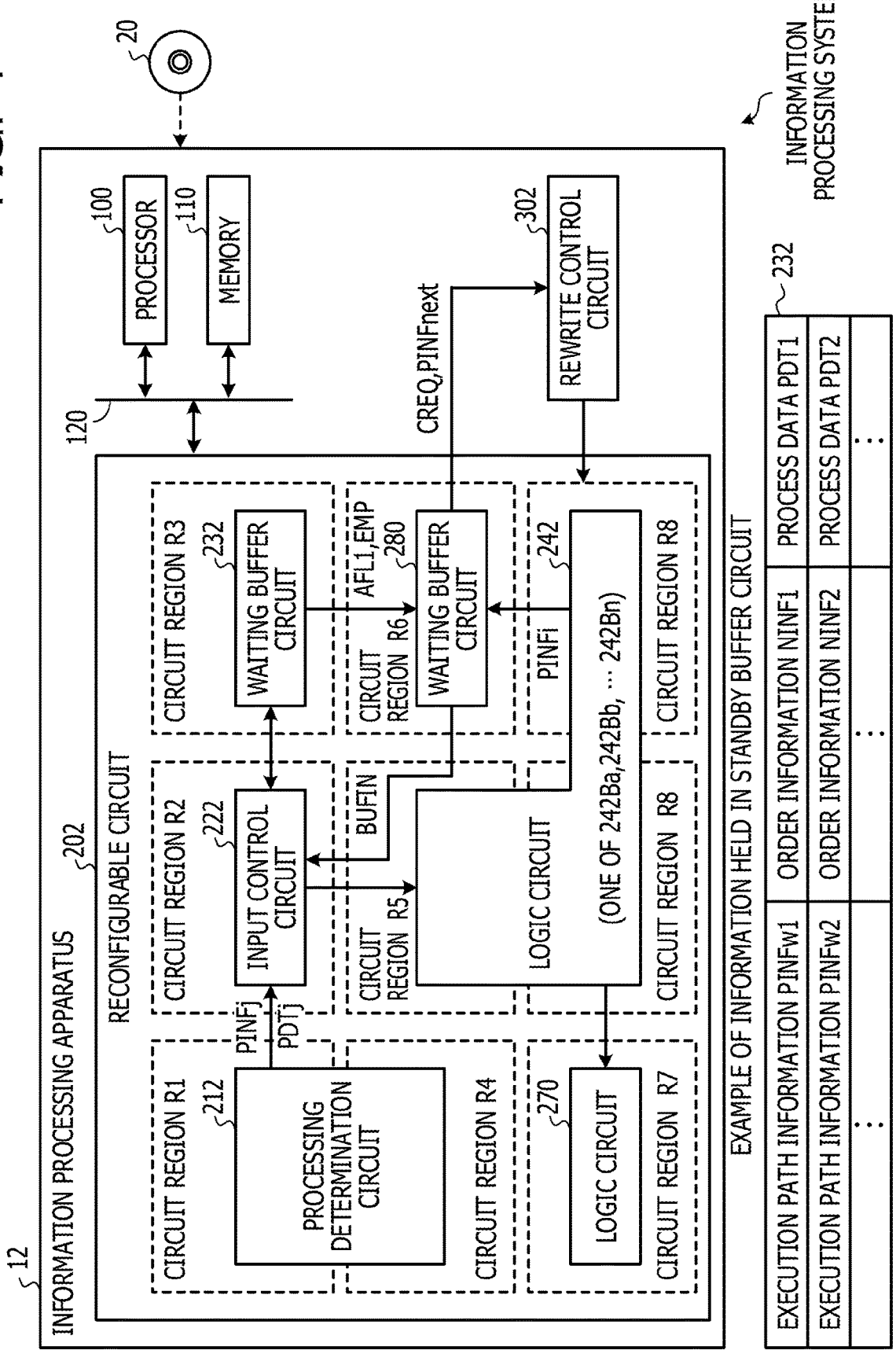
FIG. 4 is a block diagram illustrating another embodiment of the information processing apparatus, the information processing method, and the information processing program.

FIG. 4 illustrates another embodiment of the information processing apparatus, the information processing method and the information processing program. The same or similar elements as those described in FIGS. 1 to 3 are denoted by the same or similar reference numerals and detailed explanation thereof will not be repeated. An information processing apparatus 12 illustrated in FIG. 4 is, for example, a server. For example, an information processing system has an information processing apparatus 12 such as a server.

The information processing apparatus 12 includes, for example, a processor 100 such as a CPU, a memory 110, a reconfigurable circuit 202 and a rewrite control circuit 302. The processor 100, the memory 110 and the reconfigurable circuit 202 are connected to a bus 120. For example, the processor 100 executes an information processing program stored in the memory 110 to control the operation of the information processing apparatus 12.

The reconfigurable circuit 202 is, for example, an FPGA capable of rewriting a logic circuit dynamically. For example, the reconfigurable circuit 202 has plural circuit regions R (R1, R2, R3, R4, R5, R6, R7, R8, and R9) in which the logic circuit can be rewritten. The number of circuit regions R is not limited to nine.

The logic circuit of each circuit region R is rewritten by the rewrite control circuit 302. In the example illustrated in FIG. 4, the rewrite control circuit 302 writes a logic circuit functioning as a process determination circuit 212 in a circuit region group including the circuit regions R1 and R4. In addition, the rewrite control circuit 302 writes logic circuits functioning as an input control circuit 222, a standby buffer circuit 232 and a decision circuit 280 in the respective circuit regions R2, R3, and R6 and writes a logic circuit 270 in the circuit region R7. In addition, the rewrite control circuit 302 writes a logic circuit 242 in a circuit region group including the circuit regions R5, R6, and R8. The logic circuit 242 is a logic circuit reconfigured by dynamic reconfiguration. For example, when the reconfigurable circuit 202 executes a program illustrated in FIG. 5, the logic circuit 242 is reconfigured as one of logic circuits 242Ba, 242Bb, ..., 242Bn that execute processes Ba, Bb, ..., Bn, respectively. The number of logic circuits 242B to be reconfigured is not limited to the example illustrated in FIG. 4.

In this way, the reconfigurable circuit 202 illustrated in FIG. 4 includes the process determination circuit 212, the input control circuit 222, the standby buffer circuit 232, the logic circuits 242 and 270, and the decision circuit 280.

The process determination circuit 212 is the same as or similar to the process determination circuit 210 illustrated in FIG. 1. For example, the process determination circuit 212 determines which of plural processes (e.g., the processes Ba, Bb, ..., Bn illustrated in FIG. 5) to be executed. Then, the process determination circuit 212 outputs process data PDTj to be used in the determined process and execution path information PINFj indicating the determined process to the input control circuit 222.

The input control circuit 222 is the same as or similar to the input control circuit 220 illustrated in FIG. 1. For example, when the logic circuit 242 that executes the process determined by the process determination circuit 212 is not written in the reconfigurable circuit 202, the input control circuit 222 stores the new process data PDTj and the execution path information PINFj received from the process determination circuit 212 in the standby buffer circuit 232. According to this, the process determined by the process determination circuit 212 stands by as a process waiting for execution. Further, the input control circuit 222 stores order information NINF indicating the order of reception of process data PDT received from the process determination circuit 212 in the standby buffer circuit 232 in association with the process data PDTj and the execution path information PINFj.

In the example illustrated in FIG. 4, the decision circuit 280 decides whether or not the logic circuit 242 that executes the process determined by the process determination circuit 212 is written in the reconfigurable circuit 202. When the logic circuit 242 that executes the process determined by the process determination circuit 212 is not written in the reconfigurable circuit 202, the input control circuit 222 receives from the decision circuit 280 a storage request BUFIN requesting storage of, for example, the process data PDTj in the standby buffer circuit 232. According to this, when the logic circuit 242 that executes the process determined by the process determination circuit 212 is not written in the reconfigurable circuit 202, the input control circuit 222 stores, for example, the process data PDTj in the standby buffer circuit 232. In addition, the input control circuit 222 may decide whether or not the logic circuit 242 that executes the process determined by the process determination circuit 212 is written in the reconfigurable circuit 202, and may notify the decision result to the decision circuit 280.

The standby buffer circuit 232 is the same as or similar to the standby buffer circuit 230 illustrated in FIG. 1. For example, the standby buffer circuit 232 holds the process data PDT to be used in a process waiting for execution among the processes determined by the process determination circuit 212. The bracket illustrated in FIG. 4 shows an example of information held in the standby buffer circuit 232. For example, the standby buffer circuit 232 holds execution path information PINFw (PINFw1, PINFw2, ...), order information NINF (NINF1, NINF2, ...) and process data PDT (PDT1, PDT2, ...).

The execution path information PINFw is execution path information PINF transferred from the input control circuit 222 to the standby buffer circuit 232, of the execution path information PINFj output from the process determination circuit 212 to the input control circuit 222. In FIG. 4, numerals (1, 2, ...) are added to the tail of symbol in order to distinguish plural execution path information PINFw. Similarly, numerals (1, 2, ...) are added to the tail of symbol in order to distinguish plural order information NINF and numerals (1, 2, ...) are added to the tail of symbol in order to distinguish plural process data PDT. The numerals at the tails of symbols of the execution path information PINFw, the order information NINF and the process data PDT correspond to each other.

The logic circuit 270 is a logic circuit at the next stage of the logic circuit 242 and uses the process result of the logic circuit 242 to execute a predetermined process.

The decision circuit 280 is an example of a first decision circuit that decides whether or not the amount of process data PDT held in the standby buffer circuit 232 exceeds a first predetermined amount. For example, based on the execution path information PINFi received from the logic circuit 242, and almost full information AFL1 received from the standby buffer circuit 232, the decision circuit 280 decides whether or not the amount of process data PDT held in the standby buffer circuit 232 exceeds the first predetermined amount. The execution path information PINFi is execution path information PINF indicating a process to be executed in the current logic circuit 242 written in the reconfigurable circuit 202. The almost full information AFL1 is information indicating that the number of process data PDT held in the standby buffer circuit 232 has reached a predetermined first decision value. For example, the almost full information AFL1 of logic 1 indicates that the number of process data PDT held in the standby buffer circuit 232 is equal to or greater than the first decision value. The almost full information AFL1 of logic 0 indicates that the number of process data PDT held in the standby buffer circuit 232 is smaller than the first decision value.

The first decision value is determined in advance according to the first predetermined amount. For example, when the first predetermined amount is a data amount obtained by multiplying the data amount of one information group including the execution path information PINFw, the order information NINF and the process data PDT by (k−1), the first decision value is preset to (k−1). When the size of storage area of the standby buffer circuit 232 is a size for storing k information groups, the first decision value preset to (k−1) indicates that the standby buffer circuit 232 has a space for storing one information group.

For example, when the number of process data PDT held by the standby buffer circuit 232 is equal to or greater than the first decision value and the number of process data PDT held by the standby buffer circuit 232 increases, the decision circuit 280 decides that the amount of process data PDT held by the standby buffer circuit 232 exceeds the first predetermined amount. Incidentally, the case where the number of process data PDT held by the standby buffer circuit 232 increases refers to, for example, a case where the process data PDTj is stored in the standby buffer circuit 232 and the process data PDT held in the standby buffer circuit 232 is not output to the logic circuit 242. In other words, when the logic circuit that executes the process determined by the process determination circuit 212 is different from the current logic circuit 242 and neither process waiting for execution can be executed in the current logic circuit 242, the number of process data PDT held in the standby buffer circuit 232 increases.

In this manner, the decision circuit 280 decides whether or not the amount of process data PDT held in the standby buffer circuit 232 exceeds the first predetermined amount. Then, for example, when the amount of process data PDT held in the standby buffer circuit 232 exceeds the first predetermined amount, the decision circuit 280 outputs a rewrite request CREQ requesting rewriting of the logic circuit 242 and the execution path information PINFnext to the rewrite control circuit 302. The execution path information PINFnext is execution path information PINF indicating the process B to be executed by the rewritten logic circuit 242. When the decision circuit 280 uses the execution path information PINFnext to request the rewrite control circuit 302 to rewrite the current logic circuit 242, the decision circuit 280 may hold the execution path information PINFnext as the execution path information PINFi. In this case, a process of transferring the execution path information PINFi from the current logic circuit 242 to the decision circuit 280 may be omitted.

When keeping the process determined by the process determination circuit 212 standby, the decision circuit 280 outputs to the input control circuit 222 a storage request BUFIN requesting storage of, for example, the process data PDTj transferred from the process determination circuit 212 to the input control circuit 222 in the standby buffer circuit 232.

The rewrite control circuit 302 is the same as or similar to the rewrite control circuit 300 illustrated in FIG. 1. For example, the rewrite control circuit 302 rewrites the current logic circuit 242 based on the decision result of the decision circuit 280.

The configuration of the information processing apparatus 12 is not limited to the example illustrated in FIG. 4. For example, the information processing apparatus 12 may have the decision circuit 280 outside the reconfigurable circuit 202 without writing the logic circuit functioning as the decision circuit 280 in the reconfigurable circuit 202.

Figure 5:
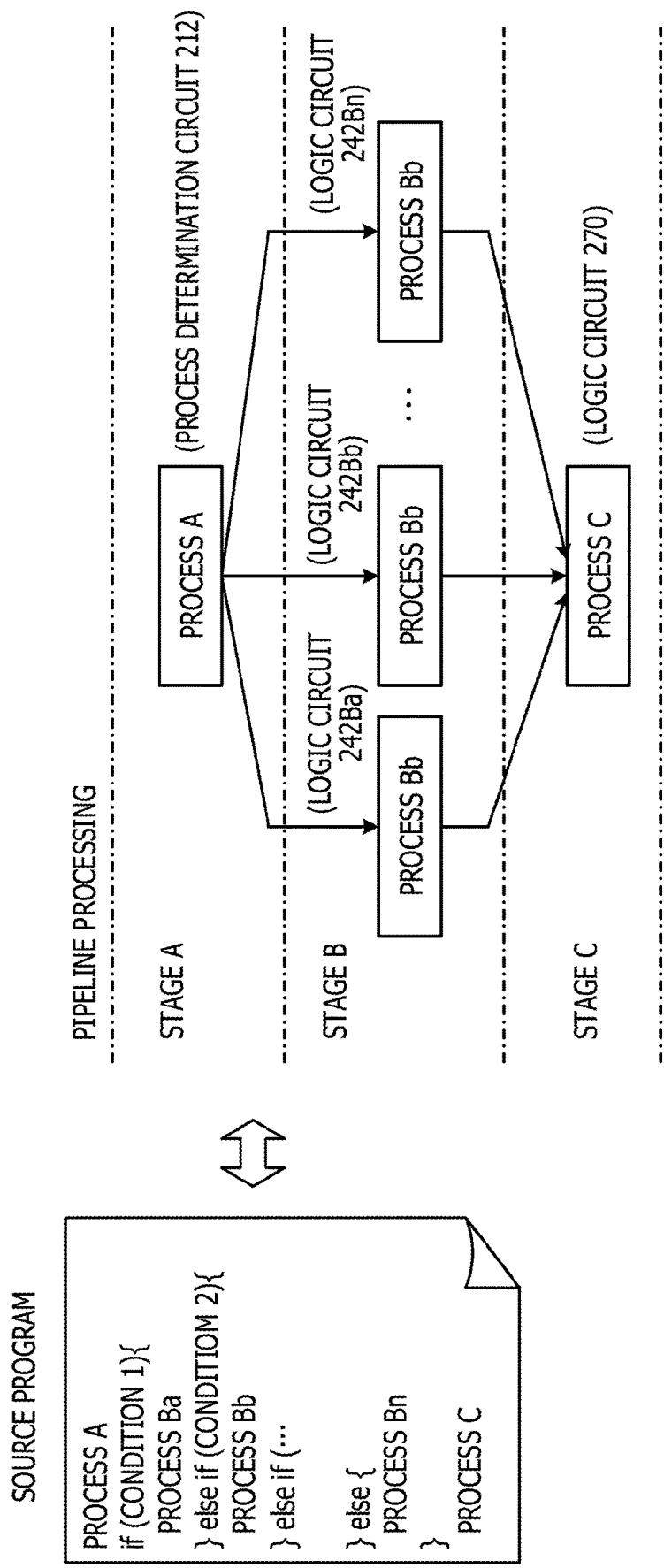
FIG. 5 is a view illustrating an example of pipeline processing executed by a reconfigurable circuit illustrated in FIG. 4.

FIG. 5 illustrates an example of pipeline processing executed by the reconfigurable circuit 202 illustrated in FIG. 4. A source program illustrated in FIG. 5 causes the reconfigurable circuit 202 to repeatedly execute pipeline processing by a pipeline having a stage A for executing a process A, a stage B for executing a process B (Ba, Bb, . . . , Bn) and a stage C for executing a process C. The process B (Ba, Bb, . . . , Bn) is a process at a branch destination of the process A, and which of the processes Ba, Bb, . . . , Bn is to be branched is determined by a conditional statement.

For example, the process determination circuit 212 determines a branch destination of a process in the A stage. That is, the process determination circuit 212 executes in the A stage the process A for determining which process B among the plural processes B is to be executed. Further, the logic circuit 242 executes any one of the processes Ba, Bb, . . . , Bn in the B stage. Then, the logic circuit 270 uses the processing result of the process B to execute the process C at the C stage.

In the example illustrated in FIG. 5, when one of the plural logic circuits 242 B executing the respective processes Ba, Bb, . . . , Bn is written in the reconfigurable circuit 202, a space of a circuit region R for writing another logic circuit 242B becomes insufficient. For this reason, the logic circuit 242B written in the reconfigurable circuit 202 is dynamically reconfigured to a logic circuit 242B (one of 242Ba, 242Bb, . . . , 242Bn) that executes any one of the processes Ba, Bb, . . . , Bn. The reconfiguration of the logic circuit 242B is executed by the rewrite control circuit 302 based on the decision result of the decision circuit 280, as described with reference to FIG. 4.

Figure 6:
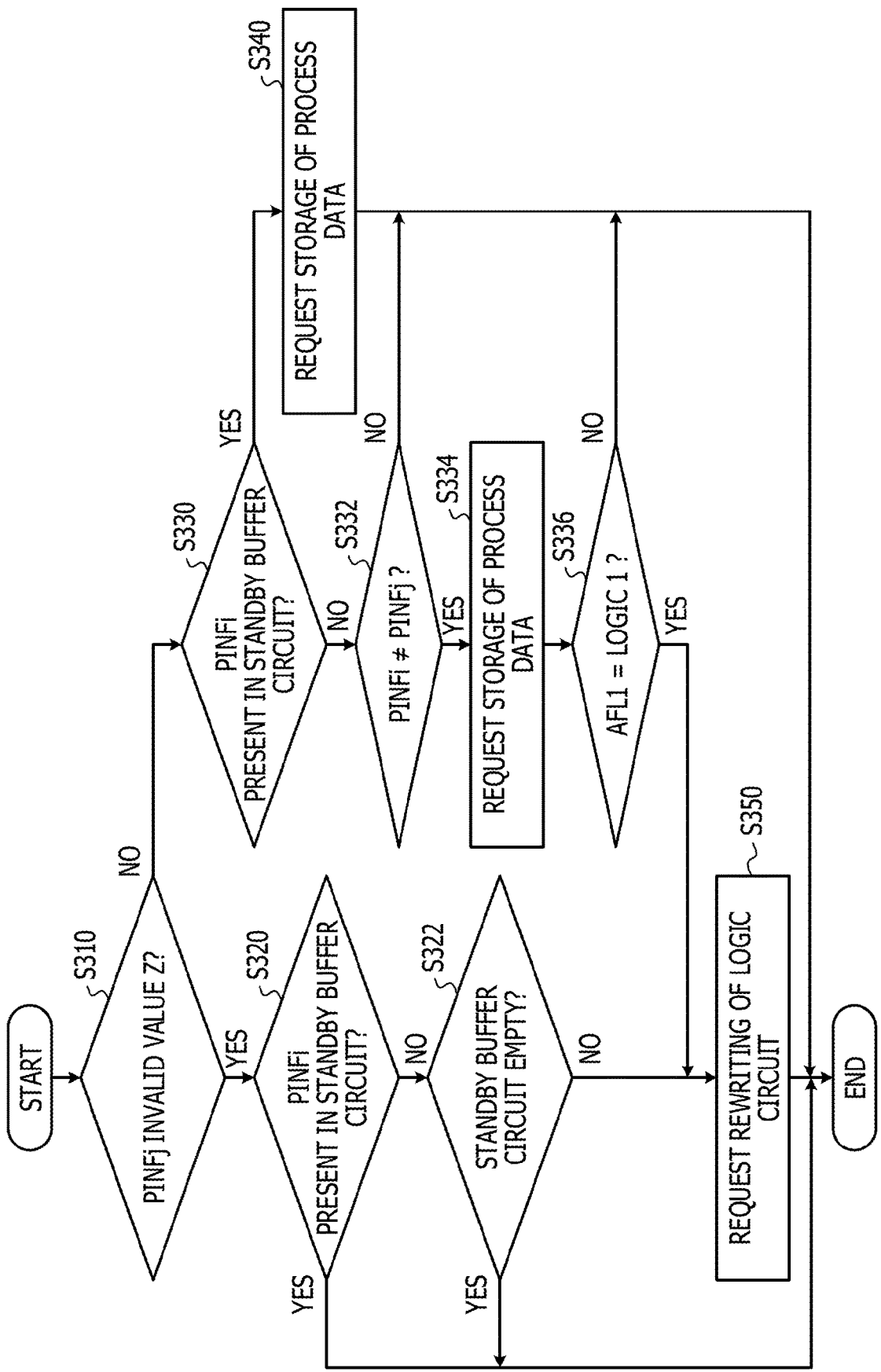
FIG. 6 is a view illustrating an example of the operation of a decision circuit illustrated in FIG. 4.

FIG. 6 illustrates an example of the operation of the decision circuit 280 illustrated in FIG. 4. The operation illustrated in FIG. 6 is one mode of an information processing method by an information processing apparatus having a reconfigurable circuit capable of rewriting a logic circuit and an information processing program for controlling the operation of the information processing apparatus.

In step S310, the decision circuit 280 decides whether or not the execution path information PINFj is an invalid value Z. For example, when the process A is not executed in the A stage, that is, when the process data PDTj is not transferred from the process determination circuit 212 to the input control circuit 222, the execution path information PINFj is set to the invalid value Z. When it is decided that the execution path information PINFj is the invalid value Z, the operation of the decision circuit 280 proceeds to step S320. Meanwhile, when it is decided that the execution path information PINFj is not the invalid value Z, that is, when, for example, the process data PDTj is transferred from the process determination circuit 212 to the input control circuit 222, the operation of the decision circuit 280 proceeds to step S330.

In step S320, the decision circuit 280 decides whether or not the execution path information PINFi indicating the process B to be executed in the current logic circuit 242 is written in the reconfigurable circuit 202 is held in the standby buffer circuit 232. For example, the decision circuit 280 decides whether or not any of the execution path information PINFw held in the standby buffer circuit 232 matches the execution path information PINFi.

When the execution path information PINFi is held in the standby buffer circuit 232, that is, when any of the execution path information PINFw held in the standby buffer circuit 232 matches the execution path information PINFi, the operation of the decision circuit 280 is ended. In this case, the current logic circuit 242 executes the process B indicated by execution path information PINFiw matching the execution path information PINFi, among the execution path information PINFiw held in the standby buffer circuit 232.

Meanwhile, when the execution path information PINFi is not held in the standby buffer circuit 232, that is, none of the execution path information PINFw held in the standby buffer circuit 232 matches the execution path information PINFi, the operation of the decision circuit 280 proceeds to step S322.

In step S322, the decision circuit 280 decides whether or not the standby buffer circuit 232 is empty. When it is decided that the standby buffer circuit 232 is not empty, that is, when the standby buffer circuit 232 holds, for example, at least one process data PDT, the decision circuit 280 requests the rewrite control circuit 302 to rewrite the logic circuit 242 in step S350 and then the operation is ended. Meanwhile, when it is decided that the standby buffer circuit 232 is empty, that is, when the standby buffer circuit 232 does not hold, for example, any process data PDT, the operation of the decision circuit 280 is ended without requesting the rewrite control circuit 302 to rewrite the logic circuit 242.

In step S330, as in step S320, the decision circuit 280 decides whether or not the execution path information PINFi indicating the process B to be executed in the current logic circuit 242 written in the reconfigurable circuit 202 is held in the standby buffer circuit 232. When it is decided that the execution path information PINFi is held in the standby buffer circuit 232, that is, when any of the execution path information PINFw held in the standby buffer circuit 232 matches the execution path information PINFi, the operation of the decision circuit 280 proceeds to step S340.

Meanwhile, when it is decided that the execution path information PINFi is not held in the standby buffer circuit 232, that is, when none of the execution path information PINFw held in the standby buffer circuit 232 matches the execution path information PINFi, the operation of the decision circuit 280 proceeds to step S332.

In step S332, the decision circuit 280 decides whether or not the execution path information PINFi is different from the execution path information PINFj. That is, the decision circuit 280 decides whether or not the logic circuit 242B executing the process B indicated by the execution path information PINFj transferred from the process determination circuit 212 to the input control circuit 222 is different from the current logic circuit 242. When it is decided that the execution path information PINFi is different from the execution path information PINFj, the operation of the decision circuit 280 proceeds to step S334.

Meanwhile, when it is decided that the execution path information PINFi matches the execution path information PINFj, the operation of the decision circuit 280 is ended. In this case, the current logic circuit 242 executes the process B indicated by the execution path information PINFj transferred from the process determination circuit 212 to the input control circuit 222.

In step S334, the decision circuit 280 requests the input control circuit 222 to store, for example, the process data PDTj transferred from the process determination circuit 212 to the input control circuit 222 in the standby buffer circuit 232. For example, the decision circuit 280 outputs to the input control circuit 222 a storage request BUFIN requesting storage of, for example, the process data PDTj transferred from the process determination circuit 212 to the input control circuit 222 in the standby buffer circuit 232. According to this, when the execution path information PINFi is different from the execution path information PINFj, the input control circuit 222 stores, for example, the process data PDTj received from the process determination circuit 212 in the standby buffer circuit 232. After executing step S334, the operation of the decision circuit 280 proceeds to step S336.

In step S336, the decision circuit 280 decides whether or not the almost full information AFL1 is logic 1. That is, the decision circuit 280 decides whether or not the number of process data PDT held in the standby buffer circuit 232 has reached the first decision value. When it is decided that the almost full information AFL1 is logic 1, the decision circuit 280 requests the rewrite control circuit 302 to rewrite the logic circuit 242 in step S350 and then ends the operation. Meanwhile, when it is decided that the almost full information AFL1 is logic 0, the decision circuit 280 ends the operation without requesting the rewrite control circuit 302 to rewrite the logic circuit 242.

In step S340, as in step S334, the decision circuit 280 requests the input control circuit 222 to store, for example, the process data PDTj transferred from the process determination circuit 212 to the input control circuit 222 in the standby buffer circuit 232. Step S340 is executed when any of the execution path information PINFw held in the standby buffer circuit 232 matches the execution path information PINFi, as described above. For example, when any of the execution path information PINFw held in the standby buffer circuit 232 matches the execution path information PINFi, the process B indicated by the execution path information PINFiw matching the execution path information PINFi is executed by the current logic circuit 242. For this reason, the input control circuit 222 stores, for example, the process data PDTj received from the process determination circuit 212 in the standby buffer circuit 232. After executing step S340, the operation of the decision circuit 280 is ended.

According to step S340, when there is a process B waiting for execution that can be executed in the current logic circuit 242, the input control circuit 222 keeps the process B determined by the process determination circuit 212 standby as the process B waiting for execution. Then, the input control circuit 222 causes the current logic circuit 242 to execute the process B waiting for execution that can be executed in the current logic circuit 242.

In step S350, the decision circuit 280 requests the rewrite control circuit 302 to rewrite the logic circuit 242, as described above. For example, the decision circuit 280 outputs a rewrite request CREQ requesting rewriting of the logic circuit 242 and the execution path information PINFnext to the rewrite control circuit 302. After executing step S350, the operation of the decision circuit 280 is ended.

According to the operation illustrated in FIG. 6, the rewriting of the logic circuit 242 is executed when the process data PDTj is not transferred from the process determination circuit 212 to the input control circuit 222 and when, for example, the process data PDT held in the standby buffer circuit 232 are not output to the current logic circuit 242. Alternatively, the rewriting of the logic circuit 242 is executed when the almost full information AFL1 is logic 1 and the number of process data PDT held in the standby buffer circuit 232 increases. The operation of the decision circuit 280 is not limited to the example illustrated in FIG. 6.

Figure 7:
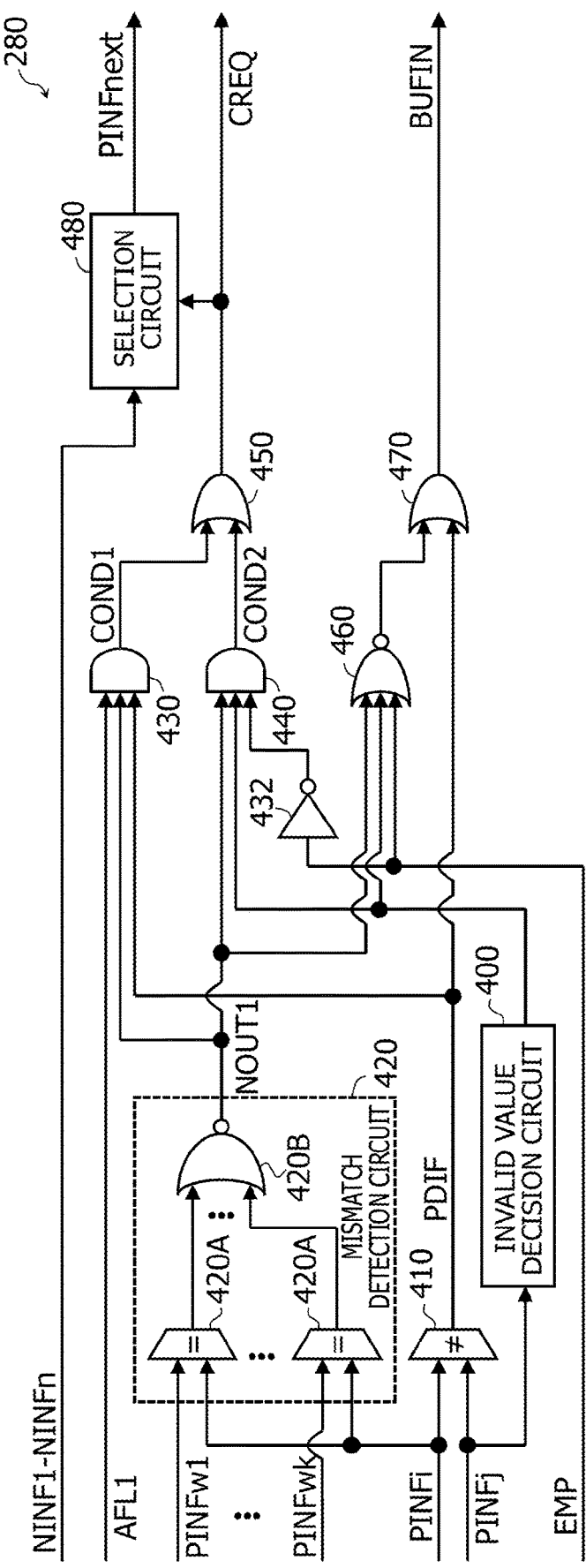
FIG. 7 is a view illustrating an example of the decision circuit illustrated in FIG. 4.

FIG. 7 illustrates an example of the decision circuit 280 illustrated in FIG. 4. The decision circuit 280 includes an invalid value decision circuit 400, a mismatch detection circuit 410, a mismatch detection circuit 420, AND circuits 430 and 440, an inverter 432, OR circuits 450 and 470, a NOR circuit 460, and a selection circuit 480.

The invalid value decision circuit 400 receives from the process determination circuit 212 the execution path information PINFj transferred from the process determination circuit 212 to the input control circuit 222. Then, the invalid value decision circuit 400 decides whether or not the execution path information PINFj received from the process determination circuit 212 is set to the invalid value Z, and outputs information indicating the decision result to the AND circuit 440 and the NOR circuit 460. For example, when the execution path information PINFj is the invalid value Z, the invalid value decision circuit 400 outputs the information of logic 1 to the AND circuit 440 and the NOR circuit 460. When the execution path information PINFj is not the invalid value Z, the invalid value decision circuit 400 outputs the information of logic 0 to the AND circuit 440 and the NOR circuit 460.

The mismatch detection circuit 410 decides whether or not the execution path information PINFi received from the current logic circuit 242 is different from the execution path information PINFj received from the process determination circuit 212. For example, when the execution path information PINFi is different from the execution path information PINFj, the mismatch detection circuit 410 outputs mismatch information PDIF of logic 1 to the AND circuit 430 and the OR circuit 470. When the execution path information PINFi matches the execution path information PINFj, the mismatch detection circuit 410 outputs mismatch information PDIF of logic 0 to the AND circuit 430 and the OR circuit 470. When at least one of the execution path information PINFi and the execution path information PINFj is the invalid value Z, the mismatch detection circuit 410 outputs the mismatch information PDIF of logic 0 to the AND circuit 430 and the OR circuit 470.

The invalid value decision circuit 400 and the mismatch detection circuit 410 may receive the execution path information PINFj from the process determination circuit 212 via the input control circuit 222.

The mismatch detection circuit 420 decides whether or not any of the execution path information PINFw (PINFw 1, . . . , PINFwk) held in the standby buffer circuit 232 matches the execution path information PINFi. For example, when none of the execution path information PINFw held in the standby buffer circuit 232 matches the execution path information PINFi, the mismatch detection circuit 420 outputs information NOUT1 of logic 1 to the AND circuits 430 and 440 and the NOR circuit 460. When any of the execution path information PINFw held in the standby buffer circuit 232 matches the execution path information PINFi, the mismatch detection circuit 420 outputs information NOUT1 of logic 0 to the AND circuits 430 and 440 and the NOR circuit 460. That is, when, for example, the process data PDT is not output from the standby buffer circuit 232, the mismatch detection circuit 420 outputs the information NOUT1 of logic 1 to the AND circuits 430 and 440 and the NOR circuit 460.

For example, the mismatch detection circuit 420 includes plural match detection circuits 420A and a NOR circuit 420B. The number of match detection circuits 420A corresponds to the number of execution path information PINFw that can be held in the standby buffer circuit 232.

Each match detection circuit 420A receives the corresponding execution path information PINFw out of the plural execution path information PINFw from the standby buffer circuit 232 and receives the execution path information PINFi from the current logic circuit 242. Then, each match detection circuit 420A decides whether or not the execution path information PINFw received from the standby buffer circuit 232 matches the execution path information PINFi received from the current logic circuit 242. For example, when the execution path information PINFw matches the execution path information PINFi, the match detection circuit 420A outputs the information of logic 1 to the NOR circuit 420B. When the execution path information PINFw is different from the execution path information PINFi, the match detection circuit 420A outputs the information of logic 0 to the NOR circuit 420B. When at least one of the execution path information PINFi and the execution path information PINFw is the invalid value Z, the match detection circuit 420A outputs the information of logic 0 to the NOR circuit 420 B.

The NOR circuit 420B calculates NOR of plural information received from the plural match detection circuits 420A and outputs the information NOUT1 indicating the calculation result to the AND circuits 430 and 440 and the NOR circuit 460.

The AND circuit 430 performs the AND operation of the almost full information AFL1 received from the standby buffer circuit 232, the information NOUT1 received from the mismatch detection circuit 420 and the mismatch information PDIF received from the mismatch detection circuit 410. Then, the AND circuit 430 outputs information COND1 indicating the result of the AND operation of the almost full information AFL1, the information NOUT1 and the mismatch information PDIF to the OR circuit 450. That is, when the number of process data PDT held in the standby buffer circuit 232 is equal to or greater than the first decision value and the number of process data PDT held in the standby buffer circuit 232 increases, the AND circuit 430 outputs the information COND1 of logic 1 to the OR circuit 450. The information COND1 of logic 1 indicates that the condition for rewriting of the current logic circuit 242 is satisfied.

The inverter 432 receives information EMP from the standby buffer circuit 232 and outputs information obtained by inverting the logic of the information EMP (an inverted signal of the information EMP) to the AND circuit 440. The information EMP is information indicating that the standby buffer circuit 232 is empty. For example, the information EMP with logical value 1 indicates that the standby buffer circuit 232 is empty, that is, the standby buffer circuit 232 does not hold, for example, any process data PDT. The information EMP with logical value 0 indicates that the standby buffer circuit 232 is not empty, that is, the standby buffer circuit 232 holds, for example, at least one process data PDT.

The AND circuit 440 performs an AND operation of the information NOUT1 received from the mismatch detection circuit 420, the information received from the invalid value decision circuit 400, and the information received from the inverter 432, and outputs information COND2 indicating the AND operation result to the OR circuit 450. That is, when new process data PDTj is not output from the process determination circuit 212, and for example, the process data PDT held in the standby buffer circuit 232 is not output from the standby buffer circuit 232, the AND circuit 440 outputs the information COND2 of logic 1 to the OR circuit 450. The information COND2 of logic 1 indicates that the condition for rewriting the current logic circuit 242 is satisfied.

The OR circuit 450 performs an OR operation of the information COND1 received from the AND circuit 430 and the information COND2 received from the AND circuit 440 and outputs information indicating the OR operation result as a rewrite request CREQ to the selection circuit 480 and the rewrite control circuit 302. That is, when the condition for rewriting the current logic circuit 242 is satisfied, the OR circuit 450 outputs the rewrite request CREQ of logic 1 to the selection circuit 480 and the rewrite control circuit 302. The rewrite request CREQ of logic 1 indicates a rewrite request of the logic circuit 242.

The NOR circuit 460 performs an NOR operation of the information NOUT1 received from the mismatch detection circuit 420, the information received from the invalid value decision circuit 400, and the information EMP received from the standby buffer circuit 232, and outputs information indicating the NOR operation result to the OR circuit 470. That is, when new process data PDTj is output from the process determination circuit 212, and for example, the process data PDT is output from the standby buffer circuit 232, the NOR circuit 460 outputs the information of logic 1 to the OR circuit 470. The information of logic 1 output from the NOR circuit 460 indicates that the condition for storing the process data PDTj transferred from the process determination circuit 212 to the input control circuit 222 in the standby buffer circuit 232 is satisfied.

The OR circuit 470 performs an OR operation of the information received from the NOR circuit 460 and the mismatch information PDIF received from the mismatch detection circuit 410 and outputs information indicating the OR operation result to the input control circuit 222 as a storage request BUFIN. Here, for example, the mismatch information PDIF of logic 1 output from the mismatch detection circuit 410 to the OR circuit 470 indicates that the condition for storing the process data PDTj transferred from the process determination circuit 212 to the input control circuit 222 in the standby buffer circuit 232 is satisfied. That is, when the condition for storing the process data PDTj transferred from the process determination circuit 212 to the input control circuit 222 in the standby buffer circuit 232 is satisfied, the OR circuit 470 outputs the storage request BUFIN of logic 1 to the input control circuit 222.

The selection circuit 480 receives from the standby buffer circuit 232 the order information NINF (NINF1 to NINFn) indicating the order of reception of the process data PDT by the input control circuit 222 and receives the rewrite request CREQ from the OR circuit 450. Then, when the rewrite request CREQ is logic 1, the selection circuit 480 outputs the execution path information PINFnext to the rewrite control circuit 302. For example, when receiving the rewrite request CREQ of logic 1, the selection circuit 480 selects a process B having an earlier reception order among the plural execution waiting processes B based on the order information NINF. Then, the selection circuit 480 outputs to the rewrite control circuit 302 the execution path information PINFnext indicating the selected process B (the process B having the earlier reception order among the plural execution waiting processes). According to this, for example, the rewrite control circuit 302 rewrites the current logic circuit 240 to the logic circuit 242B executing the process B having the longest waiting time after being determined as the process B to be executed in the B stage among the plural execution waiting processes B. In this way, when the rewrite control circuit 302 rewrites the current logic circuit 242, the selection circuit 480 selects whether to rewrite the current logic circuit 242 to the logic circuit 242B executing any of the plural processes B.

The configuration of the decision circuit 280 is not limited to the example illustrated in FIG. 7. For example, the mismatch detection circuit 410, the NOR circuit 460, and the OR circuit 470 may be arranged in the input control circuit 222. In addition, for example, the selection circuit 480 may be arranged in the rewrite control circuit 302. In addition, the mismatch detection circuit 420 may include a mismatch detection circuit and an AND circuit instead of the match detection circuit 420A and the NOR circuit 420B. In addition, the NOR circuit 460 may perform a NOR operation of the information NOUT1 and the information received from the invalid value decision circuit 400 instead of performing the NOR operation of the information NOUT1, the information received from the invalid value decision circuit 400, and the information EMP. That is, the NOR circuit 460 may output to the OR circuit 470 the information indicating the result of the NOR operation of the information NOUT1 and the information received from the invalid value decision circuit 400.

FIG. 8 illustrates an example of the operation of the information processing apparatus 12 illustrated in FIG. 4. In FIG. 8, the operation of the information processing apparatus 12 will be described with an example where the number of logic circuits 242B to be reconfigured is two. The number of logic circuits 242B to be reconfigured is not limited to two. In the operation illustrated in FIG. 8, the reconfigurable circuit 202 executes pipeline processing by a pipeline having a stage A for executing a process A, a stage B for executing a process B and a stage C for executing a process C. The process A is a process of determining which process B among the plural processes B (Ba and Bb) is to be executed. Numerals added to the tails of symbols of the processes A, Ba, Bb and C illustrated in FIG. 8 denote the order of input to the pipeline. A symbol DR illustrated in FIG. 8 indicates rewriting of the logic circuit 242 written in the reconfigurable circuit 202.

In the A stage of the process cycle CYC1, the process determination circuit 212 decides a branch destination of a process A1 and determines a process Ba1 of the plural processes B (Ba and Bb) as a process B to be executed in the B stage. In FIG. 8, before starting the process cycle CYC1, the logic circuit 242 is configured to a logic circuit 242Ba that executes the process Ba out of the logic circuits 242Ba and 242Bb. Therefore, both the execution path information PINFj and the execution path information PINFi indicate the process Ba. In the example illustrated in FIG. 4, the logic circuit 242Ba is written in the circuit region group including the circuit regions R5, R8 and R9. In this case, there is an insufficient space in the circuit region R for writing the logic circuit 242Bb. Therefore, one of the logic circuits 242Ba and 242Bb is written in the reconfigurable circuit 202.

Since, for example, the process data PDT are not held in the standby buffer circuit 232, the execution path information PINFw that matches the execution path information PINFi is not held in the standby buffer circuit 232. Therefore, the information NOUT1 is logic 1. In addition, since the number of process data PDT held in the standby buffer circuit 232 is smaller than the first decision value, the almost full information AFL1 is logic 0. In the example illustrated in FIG. 8, the first decision value is preset to "2."

In the A stage of the process cycle CYC2, the process determination circuit 212 decides a branch destination of a process A2 and determines a process Ba2 of the plural processes B (Ba and Bb) as a process B to be executed in the B stage. Therefore, both the execution path information PINFj and the execution path information PINFi indicate the process Ba. In the B stage of the process cycle CYC2, the input control circuit 222 causes the current logic circuit 242Ba written in the reconfigurable circuit 202 to execute the process Ba1 determined by the process determination circuit 212 in the process cycle CYC1.

In the A stage of the process cycle CYC3, the process determination circuit 212 decides a branch destination of a process A3 and determines a process Ba3 of the plural processes B (Ba and Bb) as a process B to be executed in the B stage. Therefore, both the execution path information PINFj and the execution path information PINFi indicate the process Ba. In the B stage of the process cycle CYC3, the input control circuit 222 causes the current logic circuit 242Ba to execute the process Ba2 determined by the process determination circuit 212 in the process cycle CYC2. In the C stage of the process cycle CYC3, the logic circuit 270 executes the process C1 by using the result of the process Ba1 executed in the process cycle CYC2.

In the A stage of the process cycle CYC4, the process determination circuit 212 decides a branch destination of a process A4 and determines a process Ba4 of the plural processes B (Ba and Bb) as a process B to be executed in the B stage. Therefore, the execution path information PINFj indicates the process Bb. Since rewriting of the current logic circuit 242Ba is not executed, the execution path information PINFi indicates the process Ba. Therefore, the execution path information PINFj and the execution path information PINFi are different from each other. In FIG. 8, when the execution path information PINFj and the execution path information PINFi are different from each other, it is emphasized by a thick frame. Since the execution path information PINFj and the execution path information PINFi are different from each other, the mismatch information PDIF changes from logic 0 to logic 1. As the mismatch information PDIF changes from logic 0 to logic 1, the storage request BUFIN also changes from logic 0 to logic 1.

In the B stage of the process cycle CYC4, the input control circuit 222 causes the current logic circuit 242Ba to execute the process Ba3 determined by the process determination circuit 212 in the process cycle CYC3. In the C stage of the process cycle CYC4, the logic circuit 270 executes a process C2 by using the result of the process Bat executed in the process cycle CYC3.

In the A stage of the process cycle CYC5, the process determination circuit 212 decides a branch destination of a process A5 and determines a process Ba5 of the plural processes B (Ba and Bb) as a process B to be executed in the B stage. Therefore, both the execution path information PINFj and the execution path information PINFi indicate the process Ba.

In the process cycle CYC5, since the input control circuit 222 receives the storage request BUFIN of logic 1 in the process cycle CYC4, the input control circuit 222 stores in the standby buffer circuit 232, for example, the execution path information PINF indicating the process Bb4 determined by the process determination circuit 212 in the process cycle CYC4. In FIG. 8, the contents of the execution path information PINFw and the order information NINF among the execution path information PINFw, the order information NINF and the process data PDT stored in the standby buffer circuit 232 are illustrated in a standby buffer circuit field. For example, in the process cycle CYC5, the execution path information PINFw stored in the standby buffer circuit 232 indicates the process Bb and the order information NINF stored in the standby buffer circuit 232 indicates that the reception order is the fourth. Since, for example, the execution path information PINF indicating the process Bb4 is stored in the standby buffer circuit 232, the process Bb4 is on standby as a process Bb4 waiting for execution.

That is, in the B stage of the process cycle CYC5, the process B is not executed. In the C stage of the process cycle CYC5, the logic circuit 270 executes the process C3 by using the result of the process Ba3 executed in the process cycle CYC4.

In the A stage of the process cycle CYC6, the process determination circuit 212 decides a branch destination of a process A6 and determines a process Ba6 of the plural processes B (Ba and Bb) as a process B to be executed in the B stage. Therefore, both the execution path information PINFj and the execution path information PINFi indicate the process Ba. In the B stage of the process cycle CYC6, the input control circuit 222 causes the current logic circuit 242Ba to execute the process Ba5 determined by the process determination circuit 212 in the process cycle CYC5. In the C stage of the process cycle CYC6, since the process B is not executed in the B stage of the process cycle CYC5, the process C is not executed.

In the A stage of each of the process cycles CYC7 to CYC11, the processes A7 to A11 are executed, respectively. The process A11 is the last process A to be input to the stage A. In the B stages of each of the process cycles CYC7 to CYC11, the processes B6 to B10 are executed, respectively. In the C stage of each of the process cycles CYC7 to CYC11, the processes C5 to C9 are executed, respectively.

After the process cycle CYC12, since the process A is not input to the A stage, the execution path information PINFj indicates the invalid value Z. In the process cycle CYC12, since rewriting of the current logic circuit 242Ba is not executed, the execution path information PINFi indicates the process Ba. Since the execution path information PINFw (the process Bb) and the execution path information PINFi held in the standby buffer circuit 232 are different from each other, the information NOUT1 is maintained at logic 1. Since the execution path information PINFj is the invalid value Z and the information NOUT1 is logic 1, the information COND2 changes from logic 0 to logic 1. According to this, the rewrite control circuit 302 starts the rewriting DR of the current logic circuit 242Ba from the next process cycle CYC13.

In the B stage of the process cycle CYC12, the input control circuit 222 causes the current logic circuit 242Ba to execute a process Ba11 determined by the process determination circuit 212 in the process cycle CYC11. In the C stage of the process cycle CYC12, the logic circuit 270 executes the process C10 by using the result of a process Ba10 executed in the process cycle CYC11.

In the process cycle CYC13, the rewrite control circuit 302 rewrites the current logic circuit 242Ba to the logic circuit 242Bb (as indicated by shading in FIG. 8). The execution path information PINFi is updated to information indicating the process Bb to be executed by the rewritten logic circuit 242Bb. According to this, since the execution path information PINFi (process Bb) matches the execution path information PINFw (process Bb) held in the standby buffer circuit 232, the information NOUT1 changes from logic 1 to logic 0.

In the C stage of the process cycle CYC13, the logic circuit 270 executes the process C11 by using the result of a process Ba11 executed in the process cycle CYC12.

In the process cycle CYC14, the rewrite control circuit 302 continues to execute the rewriting DR of the logic circuit 242. In the example illustrated in FIG. 8, the number of process cycles CYC required for the rewriting DR of the logic circuit 242 is two (the process cycles CYC13 and CYC14). The number of process cycles CYC required for the rewriting DR of the logic circuit 242 is not limited to two. In the C stage of the process cycle CYC14, since the process B is not executed in the B stage of the process cycle CYC13, the process C is not executed.

In the B stage of the process cycle CYC15, the input control circuit 222 causes the current logic circuit 242Bb (the rewritten logic circuit 242Bb) written in the reconfigurable circuit 202 to execute the process Bb4 waiting for execution. For example, the input control circuit 222 transfers, for example, the process data PDT held in the standby buffer circuit 232 to the current logic circuit 242Bb, and causes the current logic circuit 242Bb to execute the process Bb4 waiting for execution. According to this, the standby buffer circuit 232 enters an empty state in which no process data PDT or the like is held. Therefore, the information NOUT1 changes from logic 0 to logic 1. In the C stage of the process cycle CYC15, since the process B is not executed in the B stage of the process cycle CYC14, the process C is not executed.

In the C stage of the process cycle CYC16, the logic circuit 270 executes the process C4 by using the result of a process Bb4 executed in the process cycle CYC15. According to this, the series of processes input to the pipeline is ended.

In this way, when the process Bb4 which cannot be executed in the current logic circuit 242Ba in the process cycle CYC4 is determined as the process B to be executed in the B stage, the information processing apparatus 12 waits for the execution of the process Bb4 and waits for rewriting DR of the current logic circuit 242Ba. That is, in the information processing apparatus 12, the logic circuit 242 is not rewritten every time the process B which cannot be executed in the current logic circuit 242 is determined as the process B to be executed in the B stage. Therefore, as compared with the conventional method in which the logic circuit 242 is rewritten each time the process B which cannot be executed in the current logic circuit 242 is determined as the process B to be executed in the B stage, the information processing apparatus 12 can suppress an increase in the number of times of dynamic reconfiguration when executing the plural processes Ba and Bb. As a result, in the information processing apparatus 12, it is possible to suppress an increase in the number of process cycles CYC required to execute the plural processes B, as compared with the conventional method.

As described above, the embodiment illustrated in FIGS. 4 to 8 can achieve the same effects as the embodiment illustrated in FIGS. 1 to 3. For example, as compared with a case where the logic circuit 242 is rewritten each time the process B which cannot be executed in the current logic circuit 242 is determined as the process B to be executed in the B stage, it is possible to reduce the number of times of rewriting of the logic circuit 242. That is, it is possible to suppress an increase in the number of times of dynamic reconfiguration when the plural processes B are executed in the reconfigurable circuit 202 capable of rewriting the logic circuit.

This can improve the performance of the information processing apparatus 12. In particular, when the time required for rewriting the logic circuit 242 is longer than the time taken for the logic circuit 242 to execute the process B, the effect of improving the performance of the information processing apparatus 12 by reducing the number of times of rewriting of the logic circuit 242 is growing.

In addition, the decision circuit 280 decides whether or not the amount of process data held in the standby buffer circuit 232 exceeds the first predetermined amount by deciding whether or not the number of process data PDT held in the standby buffer circuit 232 exceeds the first decision value. Accordingly, it can be easily determined whether or not the amount of process data held in the standby buffer circuit 232 exceeds the first predetermined amount.

Further, the input control circuit 222 stores the order information NINF indicating the reception order in the standby buffer circuit 232 in association with the process data PDT and the execution path information PINFj. By using the order information NINF, it is possible to easily select the process B having the longest standby time after being determined as the process B to be executed in the B stage, among the plural processes B waiting for execution.

Figure 9:
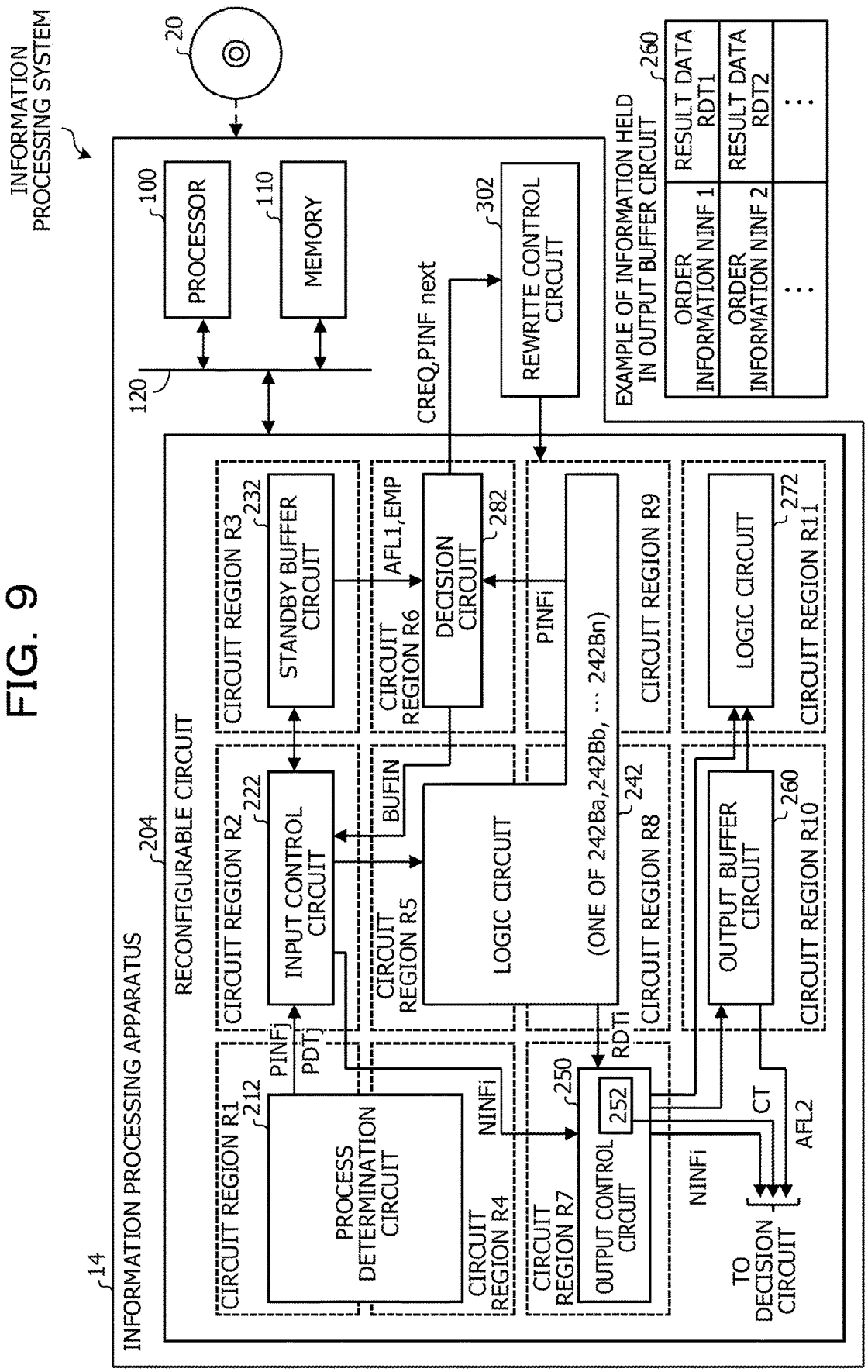
FIG. 9 is a block diagram illustrating another embodiment of the information processing apparatus, the information processing method, and the information processing program.

FIG. 9 illustrates another embodiment of the information processing apparatus, the information processing method and the information processing program. The same or similar elements as those described in FIGS. 1 to 8 are denoted by the same or similar reference numerals and detailed explanation thereof will not be repeated. An information processing apparatus 14 illustrated in FIG. 9 is, for example, a server. For example, an information processing system has an information processing apparatus 14 such as a server.

The information processing apparatus 14 has the same or similar configuration as the information processing apparatus 12 illustrated in FIG. 4 except that the former includes a reconfigurable circuit 204 in place of the reconfigurable circuit 202 illustrated in FIG. 4. For example, the information processing apparatus 14 includes a processor 100 such as a CPU, a memory 110, a reconfigurable circuit 204 and a rewrite control circuit 302 and executes pipeline processing by using the reconfigurable circuit 204. The processor 100, the memory 110 and the reconfigurable circuit 204 are connected to a bus 120. For example, the processor 100 executes an information processing program stored in the memory 110 to control the operation of the information processing apparatus 14.

The reconfigurable circuit 204 is, for example, an FPGA capable of rewriting a logic circuit dynamically. For example, the reconfigurable circuit 204 has plural circuit regions R (R1, R2, R3, R4, R5, R6, R7, R8, R9, R10, and R11) in which the logic circuit can be rewritten. The number of circuit regions R is not limited to 11.

The logic circuit of each circuit region R is rewritten by the rewrite control circuit 302. For example, a logic circuit functioning as a process determination circuit 212 is written in a circuit region group including the circuit regions R1 and R4, and logic circuits functioning as an input control circuit 222, a standby buffer circuit 232, and a decision circuit 282 are written in the respective circuit regions R2, R3, and R6. In addition, logic circuits functioning as an output control circuit 250 and an output buffer circuit 260 are written in the respective circuit regions R7 and R10, and a logic circuit 272 is written in the circuit region R11.

In addition, a logic circuit 242 is written in a circuit region group including the circuit regions R5, R8, and R9. As described with reference to FIGS. 4 to 8, the logic circuit 242 is a logic circuit reconfigured by dynamic reconfiguration. For example, the logic circuit 242 is reconfigured as one of logic circuits 242Ba, 242Bb, . . . , 242Bn that execute processes Ba, Bb, . . . , Bn, respectively. The number of logic circuits 242B to be reconfigured is not limited to the example illustrated in FIG. 9.

In this way, the reconfigurable circuit 204 illustrated in FIG. 9 includes the process determination circuit 212, the input control circuit 222, the standby buffer circuit 232, the logic circuit 242, the output control circuit 250, the output buffer circuit 260, the logic circuit 272, and the decision circuit 282.

The process determination circuit 212 and the standby buffer circuit 232 are the same as or similar to the process determination circuit 212 and the standby buffer circuit 232 illustrated in FIG. 4. The input control circuit 222 is the same as or similar to the input control circuit 222 illustrated in FIG. 4 except that the order information NINFi corresponding to the process B to be executed by the current logic circuit 242 is transferred to the output control circuit 250.

The logic circuit 272 is a logic circuit at the next stage of the logic circuit 242 and uses the process result of the logic circuit 242 to execute a predetermined process.

The output control circuit 250 receives from the input control circuit 222 the order information NINFi corresponding to the process B to be executed by the current logic circuit 242 and receives from the logic circuit 242 the result data RDTi which is the result of the process B executed by the current logic circuit 242. Then, the output control circuit 250 transfers the result data RDT, which is the result of the process executed in the current logic circuit 242, to the next stage logic circuit 272 in the order indicated by the order information NINF corresponding to the executed process B.

For example, the output control circuit 250 includes an output counter 252 for incrementing an output number CT every time the result data RDT is transferred to the next stage logic circuit 272. Then, when the reception order indicated by the order information NINFi differs from the output number CT indicated by the output counter 252, the output control circuit 250 stores the result data RDTi received from the current logic circuit 242 in the output buffer circuit 260 in association with the order information NINFi.

According to this, the output buffer circuit 260 holds the result data RDT waiting for transfer to the next stage logic circuit 272 in association with the order information NINF. The bracket illustrated in FIG. 9 shows an example of information held in the output buffer circuit 260. For example, the output buffer circuit 260 holds the order information NINF (NINF1, NINF2, . . . ) and the result data RDT (PDT1, PDT2, . . . ). In FIG. 9, numerals (1, 2, . . . ) are added to the tail of symbol in order to distinguish plural order information NINF, and numerals (1, 2, . . . ) are added to the tail of symbol in order to distinguish plural result data RDT. The numerals at the tails of symbols of the order information NINF and the result data RDT correspond to each other.

Based on, for example, the order information NINFi and the output number CT received from the output control circuit 250, and almost full information AFL2 received from the output buffer circuit 260, the decision circuit 282 decides whether or not the amount of result data RDT held in the output buffer circuit 260 exceeds a second predetermined amount. Other operations of the decision circuit 282 are the same as or similar to those of the decision circuit 280 illustrated in FIG. 4.

Here, the almost full information AFL2 is information indicating that the number of result data RDT held in the output buffer circuit 260 has reached a predetermined second decision value. For example, the almost full information AFL2 of logic 1 indicates that the number of process data PDT held in the output buffer circuit 260 is equal to or larger than the second decision value. Further, the almost full information AFL2 of logic 0 indicates that the number of result data RDT held in the output buffer circuit 260 is smaller than the second decision value.

The second decision value is predetermined according to the second predetermined amount. For example, when the second predetermined amount is data amount obtained by multiplying the data amount of one information group including the order information NINF and the result data RDT by (m−1), the second decision value is preset to (m−1). When the size of storage area of the output buffer circuit 260 is a size for storing m information groups, the second decision value preset to (m−1) indicates that the output buffer circuit 260 has a space for storing one information group.

For example, when the number of result data RDT held by the output buffer circuit 260 is equal to or greater than the second decision value and the number of result data RDT held by the output buffer circuit 260 increases, the decision circuit 282 decides that the amount of result data RDT held by the output buffer circuit 260 exceeds the second predetermined amount. Incidentally, the case where the number of result data RDT held by the output buffer circuit 260 increases refers to, for example, a case where the result data RDTi is stored in the output buffer circuit 260 and the result data RDT held in the output buffer circuit 260 is not output to the logic circuit 272. In other words, when the output numbers CT do not match any of the reception orders indicated by the order information NINF held in the output buffer circuit 260 and the order information NINFi received from the input control circuit 222, the number of result data RDT held in the output buffer circuit 260 increases.

In this way, in addition to deciding whether or not the amount of process data PDT held in the standby buffer circuit 232 exceeds the first predetermined amount, the decision circuit 282 decides whether or not the amount of result data RDT held in the output buffer circuit 260 exceeds the second predetermined amount. Then, for example, when the amount of process data PDT held in the standby buffer circuit 232 exceeds the first predetermined amount or when the amount of result data RDT held in the output buffer circuit 260 exceeds the second predetermined amount, the decision circuit 282 requests rewriting of the logic circuit 242. For example, the decision circuit 282 outputs the rewrite request CREQ requesting rewriting of the logic circuit 242 and the execution path information PINFnext to the rewrite control circuit 302.

The decision circuit 282 may hold the execution path information PINFnext as the execution path information PINFi when using the execution path information PINFnext to request the rewrite control circuit 302 to rewrite the current logic circuit 242. In this case, the process of transferring the execution path information PINFi from the current logic circuit 242 to the decision circuit 282 may be omitted.

The rewrite control circuit 302 is the same as or similar to the rewrite control circuit 302 illustrated in FIG. 4. For example, the rewrite control circuit 302 rewrites the current logic circuit 242 based on the decision result of the decision circuit 282. For example, when the amount of result data RDT held in the output buffer circuit 260 exceeds the second predetermined amount, the rewrite control circuit 302 rewrites the current logic circuit 242 to the logic circuit 242B that executes the process B waiting for execution corresponding to the order information NINF indicating the same order as the output number CT.

The configuration of the information processing apparatus 14 is not limited to the example illustrated in FIG. 9. For example, the information processing apparatus 14 may have the decision circuit 282 outside the reconfigurable circuit 204 without writing the logic circuit functioning as the decision circuit 282 in the reconfigurable circuit 204. In addition, the output counter 252 may be arranged outside the output control circuit 250. Further, the decision circuit 282 may receive the order information NINFi from the input control circuit 222.

Figure 10:
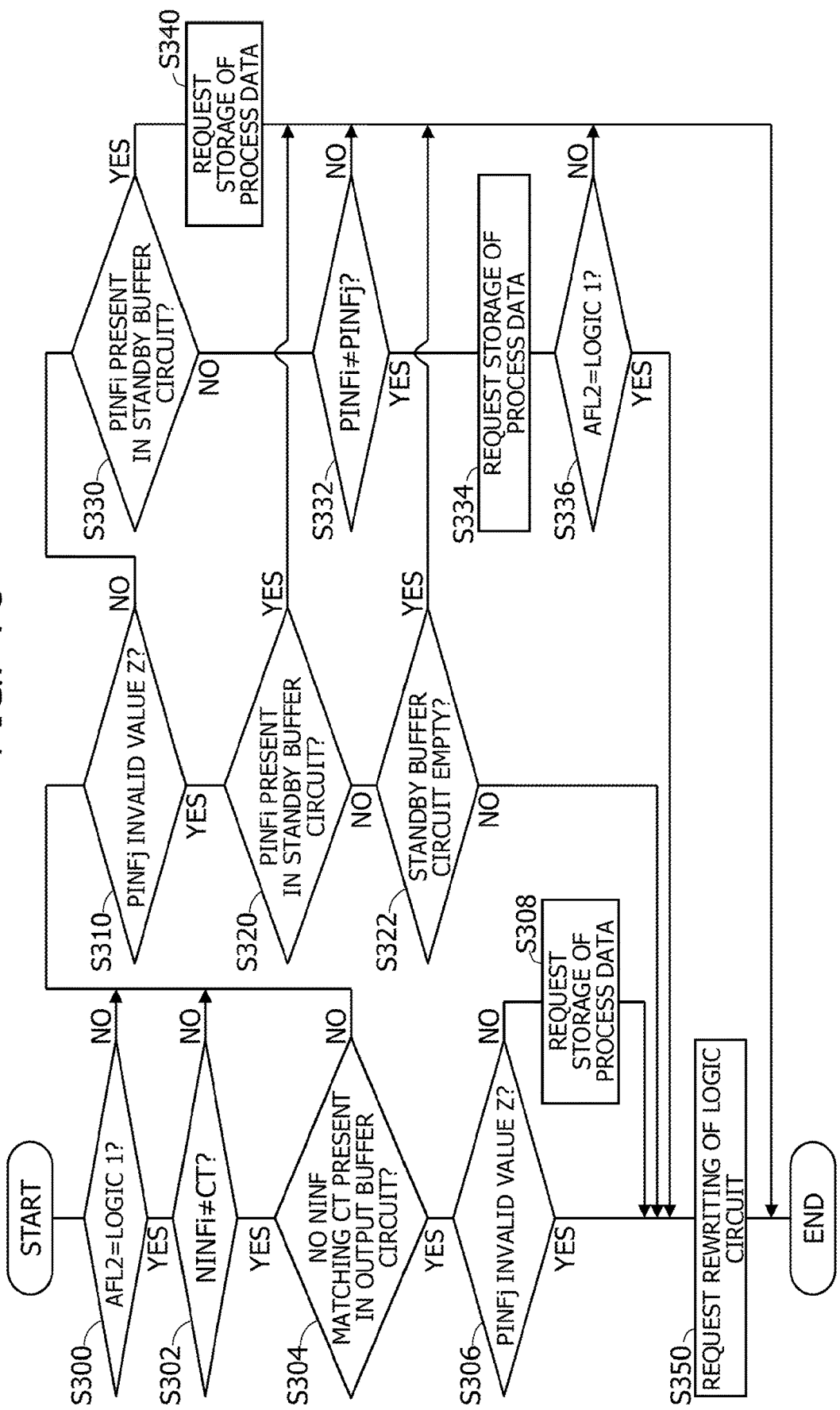
FIG. 10 is a view illustrating an example of the operation of a decision circuit illustrated in FIG. 9.

FIG. 10 illustrates an example of the operation of the decision circuit 282 illustrated in FIG. 9. The operation illustrated in FIG. 10 is one mode of an information processing method by an information processing apparatus having a reconfigurable circuit capable of rewriting a logic circuit and an information processing program for controlling the operation of the information processing apparatus. Steps that are the same as or similar to the steps described in FIG. 6 are denoted by the same or similar reference numerals and detailed explanation thereof will not be repeated. The operation illustrated in FIG. 10 is the same as or the same as the operation illustrated in FIG. 6 except that steps S300, S302, S304, S306 and S308 are added to the operation illustrated in FIG. 6. Accordingly, in FIG. 10, the steps S300 to S308 will be mainly described.

In step S300, the decision circuit 282 decides whether or not the almost full information AFL2 is logic 1. That is, the decision circuit 282 decides whether or not the number of result data RDT held in the output buffer circuit 260 has reached the second decision value. When it is decided that the almost full information AFL2 is logic 1, the operation of the decision circuit 282 proceeds to step S302. Meanwhile, when it is decided that the almost full information AFL2 is logic 0, the operation of the decision circuit 282 proceeds to step S310.

In step S302, the decision circuit 282 decides whether or not the order information NINFi received from the output control circuit 250 is different from the output number CT indicated by the output counter 252. When it is decided that the order information NINFi is different from the output number CT, the operation of the decision circuit 282 proceeds to step S304. Meanwhile, when it is decided that the order information NINFi matches the output number CT, the operation of the decision circuit 282 proceeds to step S310.

In step S304, the decision circuit 282 decides whether or not the order information NINF matching the output number CT is held in the output buffer circuit 260. For example, the decision circuit 282 decides whether or not any of the order information NINF held in the output buffer circuit 260 matches the output number CT.

When it is decided that the order information NINF matching the output number CT is not held in the output buffer circuit 260, that is, when none of the order information NINF held in the output buffer circuit 260 matches the output number CT, the operation of the decision circuit 282 proceeds to step S306. In other words, when the number of result data RDT held in the output buffer circuit 260 is equal to or greater than the second decision value and the number of result data RDT held in the output buffer circuit 260 increases, step S306 is executed.

Meanwhile, when it is decided that the order information NINF matching the output number CT is held in the output buffer circuit 260, that is, when any of the order information NINF held in the output buffer circuit 260 matches the output number CT, the operation of the decision circuit 282 proceeds to step S310.

In step S306, the decision circuit 282 decides whether or not the execution path information PINFj is an invalid value Z. When it is decided that the execution path information PINFj is an invalid value Z, the operation of the decision circuit 280 proceeds to step S350. Meanwhile, when it is decided that the execution path information PINFj is not the invalid value Z, that is, when, for example, the process data PDTj is transferred from the process determination circuit 212 to the input control circuit 222, the operation of the decision circuit 282 proceeds to step S308.

In step S308, similarly to steps S334 and S340, the decision circuit 282 requests the input control circuit 222 to store, for example, the process data PDTj transferred from the process determination circuit 212 to the input control circuit 222 in the standby buffer circuit 232. After executing step S308, the operation of the decision circuit 282 proceeds to step S350.

In step S350, the decision circuit 282 requests the rewrite control circuit 302 to rewrite the logic circuit 242. In this way, in the operation illustrated in FIG. 10, even when the number of result data RDT held in the output buffer circuit 260 is equal to or greater than the second decision value and the number of result data RDT held in the output buffer circuit 260 increases, the logic circuit 242 is rewritten. The operation of the decision circuit 282 is not limited to the example illustrated in FIG. 10.

Figure 11:
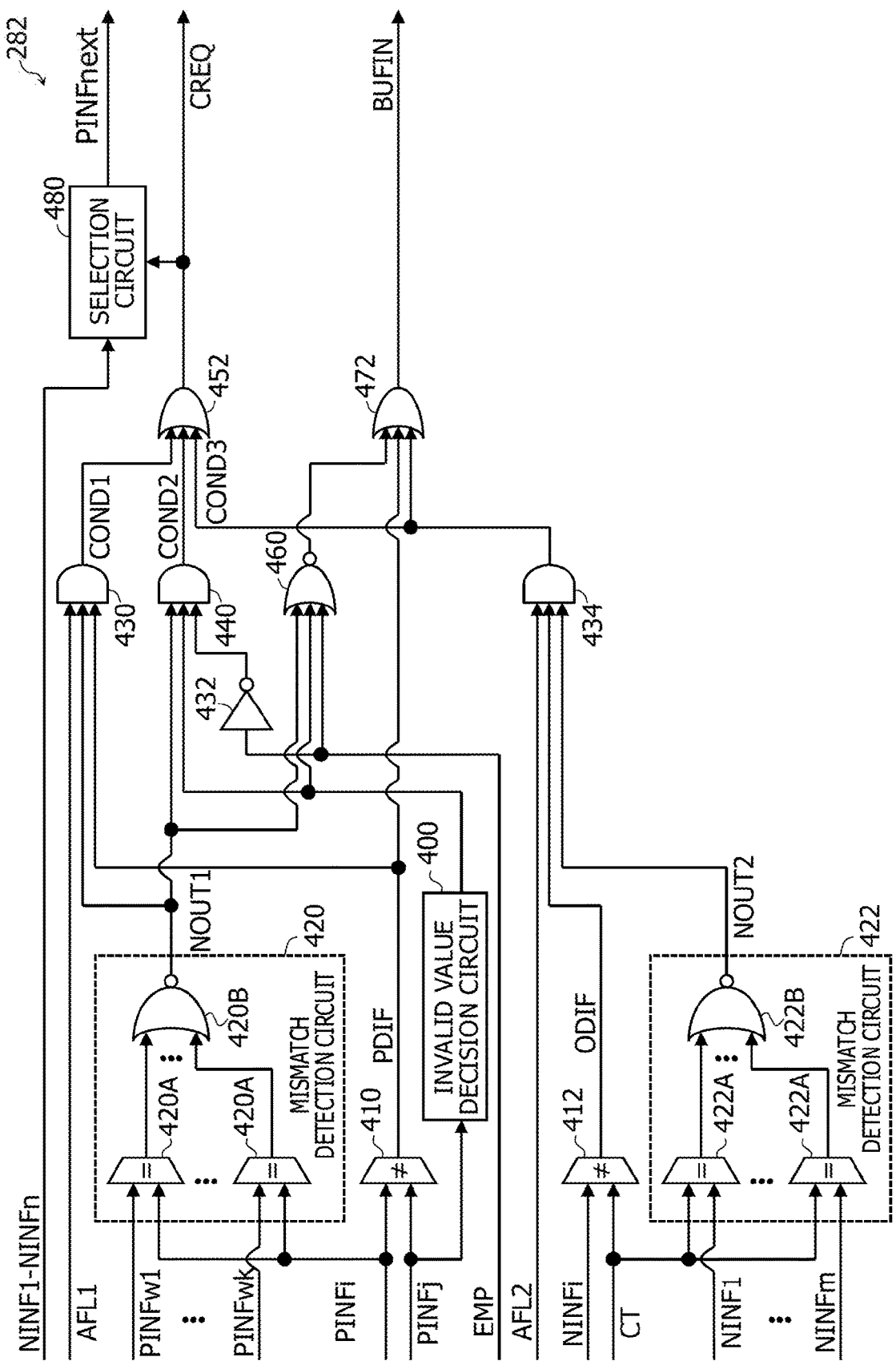
FIG. 11 is a view illustrating an example of the decision circuit illustrated in FIG. 9.

FIG. 11 illustrates an example of the decision circuit 282 illustrated in FIG. 9. In the decision circuit 282, a mismatch detection circuit 412, a mismatch detection circuit 422 and an AND circuit 434 are added to the decision circuit 280 illustrated in FIG. 7. In addition, the decision circuit 282 includes OR circuits 452 and 472 in place of the OR circuits 450 and 470 illustrated in FIG. 7. Other configurations of the decision circuit 282 are the same as or similar to those of the decision circuit 280 illustrated in FIG. 7. Therefore, in FIG. 11, the mismatch detection circuit 412, the mismatch detection circuit 422, and the AND circuit 434 will be mainly described, and detailed explanation of the elements described in FIG. 7 will not be repeated.

The decision circuit 282 includes an invalid value decision circuit 400, mismatch detection circuits 410 and 412, mismatch detection circuits 420 and 422, AND circuits 430, 434, and 440, an inverter 432, OR circuits 452 and 472, a NOR circuit 460 and a selection circuit 480.

The mismatch detection circuit 412 decides whether or not the order information NINFi received from the output control circuit 250 is different from the output number CT indicated by the output counter 252. For example, when the order information NINFi and the output number CT are different from each other, the mismatch detection circuit 412 outputs information ODIF of logic 1 to the AND circuit 434. When the order information NINFi matches the output number CT, the mismatch detection circuit 412 outputs information ODIF of logic 0 to the AND circuit 434. When at least one of the order information NINFi and the output number CT is an invalid value Z, the mismatch detection circuit 412 outputs information DIF of logic 0 to the AND circuit 434. The mismatch detection circuit 412 may receive the order information NINFi from the input control circuit 222.

The mismatch detection circuit 422 decides whether or not none of the order information NINF (NINF 1, . . . , NINFm) held in the output buffer circuit 260 matches the output number CT. For example, when none of the order information NINF held in the output buffer circuit 260 matches the output number CT, the mismatch detection circuit 422 outputs information NOUT2 of logic 1 to the AND circuit 434. When any of the order information NINF held in the output buffer circuit 260 matches the output number CT, the mismatch detection circuit 422 outputs information NOUT2 of logic 0 to the AND circuit 434. That is, when the result data RDT is not output from the output buffer circuit 260, the mismatch detection circuit 422 outputs the information NOUT2 of logic 1 to the AND circuit 434.

For example, the mismatch detection circuit 422 includes plural match detection circuits 422A and a NOR circuit 422B. The number of match detection circuits 422A corresponds to the number of order information NINF which can be held by the output buffer circuit 260.

Each match detection circuit 422A receives the corresponding order information NINF among the plural order information NINF from the output buffer circuit 260 and receives the output number CT from the output counter 252. Then, each match detection circuit 422A decides whether or not the order information NINF received from the output buffer circuit section 260 matches the output number CT received from the output counter 252. For example, when the order information NINF matches the output number CT, the match detection circuit 422A outputs information of logic 1 to the NOR circuit 422B. When the order information NINF and the output number CT are different from each other, the match detection circuit 422A outputs information of logic 0 to the NOR circuit 422B. When at least one of the order information NINF and the output number CT is an invalid value Z, the match detection circuit 422A outputs information of logic 0 to the NOR circuit 422B.

The NOR circuit 422B performs a NOR operation of the plural information received from the plural match detection circuits 422A and outputs the information NOUT2 indicating the NOR operation result to the AND circuit 434.

The AND circuit 434 performs an AND operation of the almost full information AFL2 received from the output buffer circuit 260, the information ODIF received from the mismatch detection circuit 412 and the information NOUT2 received from the mismatch detection circuit 422. Then, the AND circuit 434 outputs information COND3 indicating the AND operation result of the almost full information AFL2, the information ODIF and the information NOUT2 to the OR circuits 452 and 472. In other words, when the number of result data RDT held by the output buffer circuit 260 is equal to or greater than the second decision value and the number of result data RDT held by the output buffer circuit 260 increases, the AND circuit 434 outputs the information COND3 of logic 1 to the OR circuits 452 and 472. The information COND3 of logic 1 indicates that the condition for rewriting the current logic circuit 242 is satisfied.

The OR circuit 452 performs an OR operation of the information COND1 received from the AND circuit 430, the information COND2 received from the AND circuit 440, and the information COND3 received from the AND circuit 434. Then, the OR circuit 452 outputs information indicating the OR operation result of the information COND1, COND2, and COND3 as a rewrite request CREQ to the selection circuit 480 and the rewrite control circuit 302. That is, when the condition for rewriting the current logic circuit 242 is satisfied, the OR circuit 452 outputs the rewrite request CREQ of logic 1 to the selection circuit 480 and the rewrite control circuit 302.

The OR circuit 472 performs an OR operation of the information received from the NOR circuit 460, the mismatch information PDIF received from the mismatch detection circuit 410 and the information COND3 received from the AND circuit 434 and stores information indicating the OR operation result as a storage request BUFIN To the input control circuit 222.

Here, a circuit group including the mismatch detection circuit 412, the mismatch detection circuit 422 and the AND circuit 434 is an example of a second decision circuit for deciding whether or not the amount of result data RDT held in the output buffer circuit 260 exceeds the second predetermined amount. A circuit group including the invalid value decision circuit 400, the mismatch detection circuit 410, the mismatch detection circuit 420, the AND circuits 430 and 440, and the OR circuit 452 is an example of a first decision circuit for deciding whether or not the amount of process data PDT held in the standby buffer circuit 232 exceeds the first predetermined amount.

The configuration of the decision circuit 282 is not limited to the example illustrated in FIG. 11. For example, the mismatch detection circuit 410, the NOR circuit 460, and the OR circuit 472 may be arranged in the input control circuit 222. In addition, for example, the selection circuit 480 may be disposed in the rewrite control circuit 302. The mismatch detection circuit 412 may be disposed in the output control circuit 250. In addition, the mismatch detection circuit 420 may include a mismatch detection circuit and an AND circuit in place of the match detection circuit 420A and the NOR circuit 420B. In addition, the mismatch detection circuit 422 may include a mismatch detection circuit and an AND circuit in place of the match detection circuit 422A and the NOR circuit 422B. In addition, instead of performing the NOR operation of the information NOUT1, the information received from the invalid value decision circuit 400, and the information EMP, the NOR circuit 460 may perform a NOR operation of the information NOUT1 and the information received from the invalid value decision circuit 400. That is, the NOR circuit 460 may output information indicating the NOR operation result of the information NOUT1 and the information received from the invalid value decision circuit 400 to the OR circuit 472.

Figure 12:
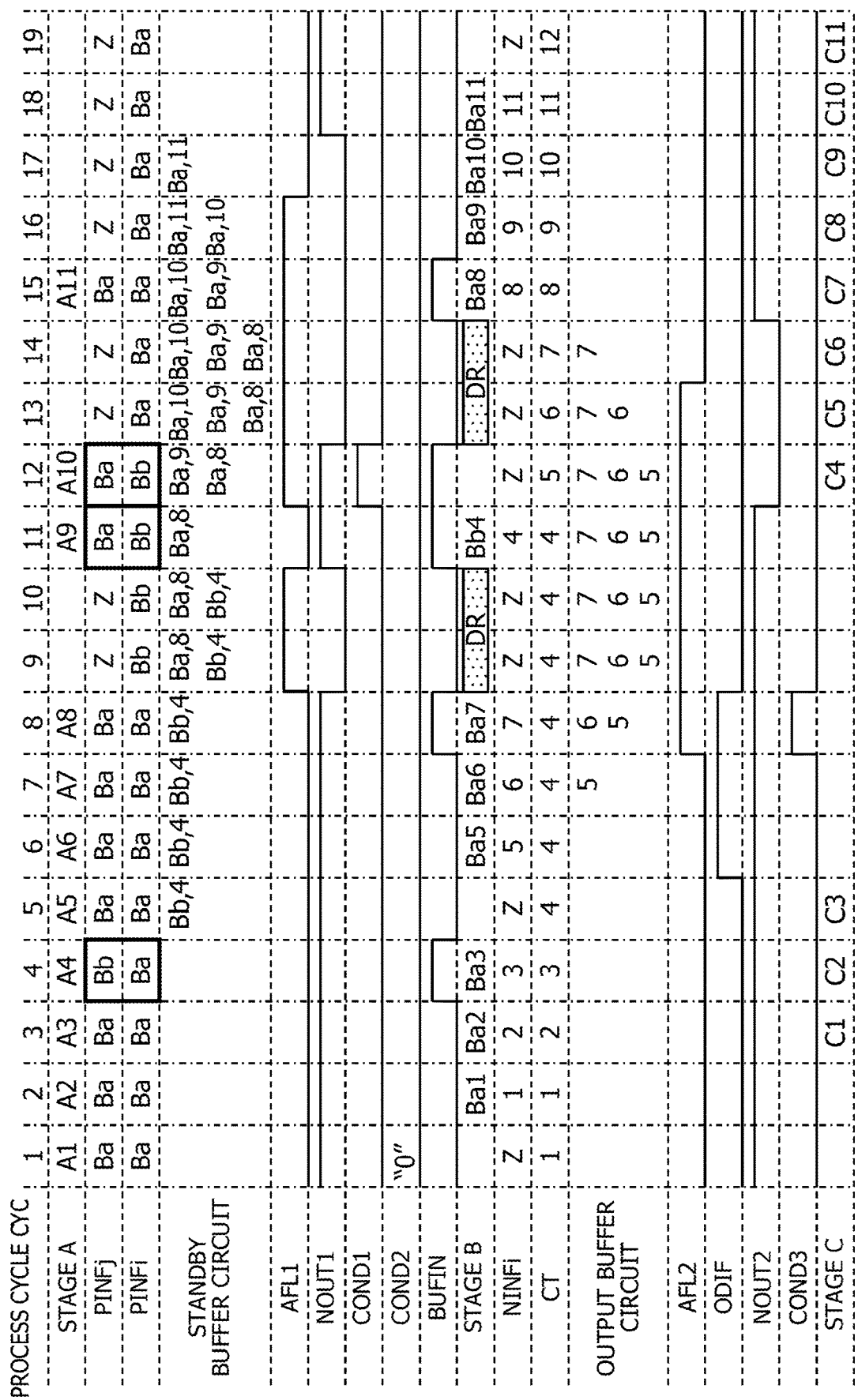
FIG. 12 is a view illustrating an example of the operation of the information processing apparatus illustrated in FIG. 9.

FIG. 12 illustrates an example of the operation of the information processing apparatus 14 illustrated in FIG. 9. For example, stages of a pipeline in the operation illustrated in FIG. 12, processes (e.g., processes A1 to A11) input to the pipeline, and the number of logic circuits 242B to be reconfigured are the same as or similar to those in the operation illustrated in FIG. 8. In FIG. 12, operations different from those in FIG. 8 will be mainly described. In FIG. 12, for easy understanding of explanation, in addition to the information illustrated in FIG. 8, the order information NINFi, the output number CT, the output buffer circuit 260, the almost full information AFL2, the information ODIF, the information NOUT2 and the information COND3 are also described. For example, in FIG. 12, the contents of the order information NINF among the order information NINF and the result data RDT stored in the output buffer circuit 260 are described in an output buffer circuit field. In FIG. 12, in order to make the figure easy to see, the description of the mismatch information PDIF described in FIG. 8 is omitted.

The operations of the process cycles CYC1 to CYC5 are the same as the operations illustrated in FIG. 8. In each of the process cycles CYC1 to CYC5, since, for example, the result data RDT is not held in the output buffer circuit 260, the order information NINF matching the output number CT is not held in the output buffer circuit 260. Therefore, the information NOUT2 is logic 1. In addition, since the number of result data RDT held in the output buffer circuit 260 is smaller than the second decision value, the almost full information AFL2 is logic 0. In the example illustrated in FIG. 12, the second decision value is preset to "2."

In the process cycle CYC6, since the process Bb4 is not executed in the B stage of the process cycle CYC5, the output number CT is maintained at "4". Therefore, in the process cycle CYC6, the order information NINFi ("5") is different from the output number CT ("4"). Therefore, the information ODIF changes from logic 0 to logic 1. Other operations of the process cycle CYC6 are the same as those illustrated in FIG. 8. In addition, since the order information NINFi ("5") is different from the output number CT ("4"), for example, the result data RDT which is the result of the process Ba5 executed in the B stage of the process cycle CYC6 are stored in the output buffer circuit 260 in the process cycle CYC7.

In the process cycle CYC7, the operations from the A stage to the B stage are the same as those illustrated in FIG. 8. In the process cycle CYC7, as described above, since the order information NINFi ("5") is different from the output number CT ("4") in the process cycle CYC6, for example, the result data RDT as the result of the process Ba5 is stored in the output buffer circuit 260. Therefore, in the C stage of the process cycle CYC7, the process C5 using the result of the process Ba5 is not executed. Since the result data RDT is not output to the logic circuit 272 at the next stage, the output number CT is maintained at "4".

In the process cycle CYC8, the operations from the A stage to the B stage are the same as those illustrated in FIG. 8. In the process cycle CYC8, since the order information NINFi ("6") is different from the output number CT ("4") in the process cycle CYC7, for example, the result data RDT as the result of the process Ba 6 is stored in the output buffer circuit 260. According to this, in the process cycle CYC8, the output buffer circuit 260 holds the two result data RDT, i.e., the result data RDT as the result of the process Ba5 and the result data RDT as the result of the process Ba6. Since the same number of result data RDT as the second decision value ("2") is held in the output buffer circuit 260, the almost full information AFL2 changes from logic 0 to logic 1.

Further, since the result data RDT as the result of the process Ba6 is stored in the output buffer circuit 260, the process C6 using the result of the process Ba6 is not executed in the C stage of the process cycle CYC8. Since the result data RDT is not output to the logic circuit 272 at the next stage, the output number CT is maintained at "4". Therefore, in the process cycle CYC8, the order information NINFi ("7") is different from the output number CT ("4") and the information ODIF is maintained at logic 1. In the process cycle CYC8, since the order information NINF matching the output number CT ("4") is not held in the output buffer circuit 260, the information NOUT2 is maintained at logic 1.

In this way, in the process cycle CYC8, since all of the almost full information AFL2, the information ODIF and the information NOUT2 are logic 1, the information COND3 changes from logic 0 to logic 1. As the information COND3 changes from logic 0 to logic 1, the storage request BUFIN also changes from logic 0 to logic 1. As the information COND3 changes from logic 0 to logic 1, the rewrite control circuit 302 starts rewriting DR of the current logic circuit 242Ba from the next process cycle CYC9.

In the process cycle CYC9, the rewriting DR of the logic circuit 242Ba is executed. For example, the rewrite control circuit 302 rewrites the current logic circuit 242Ba to the logic circuit 242Bb that executes the process B4 waiting for execution corresponding to the order information NINF indicating the same order as the output number CT ("4")

indicated by the output counter 252. In this manner, since the rewriting DR of the logic circuit 242Ba is executed in the process cycle CYC9, the process A9 is not input to the stage A. In the process cycle CYC9, since the input control circuit 222 receives the storage request BUFIN of logic 1 in the process cycle CYC8, the input control circuit 222 stores in the standby buffer circuit 232 the execution path information PINF indicating the process Ba8 determined by the process determination circuit 212 in the process cycle CYC8. Therefore, in the process cycle CYC9, the almost full information AFL1 changes from logic 0 to logic 1. In addition, since the standby buffer circuit 232 holds the execution path information PINFw (process Bb) that matches the execution path information PINFi (process Bb), the information NOUT1 changes from logic 1 to logic 0.

In addition, in the process cycle CYC9, since the order information NINFi ("7") and the output number CT ("4") in the process cycle CYC8 are different from each other, the result data RDT as the result of the process Ba7 is stored in the output buffer circuit 260.

In process cycle CYC10, the rewrite control circuit 302 continues to execute the rewriting DR of the logic circuit 242. Therefore, the process A9 is not input to the A stage. The logic circuit 242 is rewritten to the logic circuit 242Bb until the process cycle CYC10 is terminated.

In the A stage of the process cycle CYC11, the process determination circuit 212 decides a branch destination of the process A9 and determines the process Ba9 of the plural processes B (Ba and Bb) as the process B to be executed in the B stage. Therefore, the execution path information PINFj indicates the process Ba. In addition, since the logic circuit 242 is rewritten to the logic circuit 242Bb, the execution path information PINFi indicates the process Bb. Accordingly, the execution path information PINFj and the execution path information PINFi are different from each other. Therefore, the storage request BUFIN changes from logic 0 to logic 1.

In the B stage of the process cycle CYC11, the input control circuit 222 causes the current logic circuit 242Bb (the rewritten logic circuit 242Bb) written in the reconfigurable circuit 204 to execute the process Bb4 waiting for execution. For example, the input control circuit 222 transfers the process data PDT having the order information NINF "4" out of the two process data PDT held in the standby buffer circuit 232 to the current logic circuit 242Bb and causes the current logic circuit 242Bb to execute the process Bb4 waiting for execution. The process data PDT having the order information NINF "4" is the process data PDT corresponding to the execution path information PINFw that matches the execution path information PINFi (process Bb). In addition, the input control circuit 222 transfers the order information NINFi ("4") corresponding to the process data PDT transferred from the standby buffer circuit 232 to the logic circuit 242Bb to the output control circuit 250. Since the process data PDT has been transferred from the standby buffer circuit 232 to the logic circuit 242Bb, the number of process data PDT held in the standby buffer circuit 232 decreases from two to one.

In the process cycle CYC11, since the process B is not executed in the B stage of the process cycle CYC10, the output number CT is maintained at "4". Accordingly, in the process cycle CYC11, the order information NINFi ("4") matches the output number CT ("4"). Therefore, the result data RDT as the result of the process Bb4 is transferred to the logic circuit 272. According to this, in the next process cycle CYC12, the output number CT is incremented from "4" to "5."

In the A stage of the process cycle CYC12, the process determination circuit 212 decides a branch destination of the process A10 and determines the process B10 of the plural processes B (Ba and Bb) as the process B to be executed in the B stage. Therefore, the execution path information PINFj indicates the process Ba and the execution path information PINFi indicates the process Bb. Since the execution path information PINFj and the execution path information PINFi are different from each other, the storage request BUFIN is maintained at logic 1.

In the process cycle CYC12, the input control circuit 222 stores, for example, the execution path information PINF indicating the process Ba9 determined by the process determination circuit 212 in the process cycle CYC11 in the standby buffer circuit 232. Therefore, in the process cycle CYC12, the almost full information AFL1 changes from logic 0 to logic 1. In addition, since the standby buffer circuit 232 does not hold the execution path information PINFw that matches the execution path information PINFi (process Bb), the information NOUT1 is maintained at logic 1. Since the execution path information PINFj and the execution path information PINFi are different from each other and the almost full information AFL1 and the information NOUT1 are logic 1, the information COND1 changes from logic 0 to logic 1. As the information COND1 changes from logic 0 to logic 1, the rewrite control circuit 302 starts rewriting DR of the current logic circuit 242Bb from the next process cycle CYC13.

In the C stage of the process cycle CYC12, the logic circuit 272 executes the process C4 by using the result of the process Bb4 executed in the process cycle CYC11. In the process cycle CYC12, since the output buffer circuit 260 holds the order information NINF that matches the output number CT ("5"), the information NOUT2 changes from logic 1 to logic 0. Further, the output control circuit 250 transfers the result data RDT corresponding to the order information NINF matching the output number CT ("5") among the result data RDT held in the output buffer circuit 260 to the logic circuit 272. According to this, in the next process cycle CYC13, the output number CT is incremented from "5" to "6."

In the process cycle CYC13, since the rewriting DR of the logic circuit 242Ba is executed, the process A11 is not input to the A stage. In the process cycle CYC13, the input control circuit 222 stores, for example, the execution path information PINF indicating the process Ba10 determined by the process determination circuit 212 in the process cycle CYC12 in the standby buffer circuit 232. In addition, since the standby buffer circuit 232 holds the execution path information PINFw (process Ba) that matches the execution path information PINFi (process Ba), the information NOUT1 changes from logic 1 to logic 0.

In the C stage of the process cycle CYC13, the logic circuit 272 executes the process C5 by using the result data RDT corresponding to the order information NINF matching the output number CT ("5") among the result data RDT held in the output buffer circuit 260. In addition, the output control circuit 250 transfers the result data RDT corresponding to the order information NINF matching the output number CT ("6") among the result data RDT held in the output buffer circuit 260 to the logic circuit 272. According to this, in the next process cycle CYC14, the output number CT is incremented from "6" to "7."

In the process cycle CYC14, since the rewriting DR of the logic circuit 242Ba is continued, the process A11 is not input to the A stage. In the C stage of the process cycle CYC14, the logic circuit 272 executes the process C6 by using the result data RDT corresponding to the order information NINF matching the output number CT ("6") among the result data RDT held in the output buffer circuit 260. In addition, the output control circuit 250 transfers the result data RDT corresponding to the order information NINF matching the output number CT ("7") among the result data RDT held in the output buffer circuit 260 to the logic circuit 272. According to this, in the next process cycle CYC15, the output number CT is incremented from "7" to "8."

In the A stage of the process cycle CYC15, the process determination circuit 212 decides a branch destination of the process A11 and determines the process B11 of the plural process B (Ba and Bb) as the process B to be executed in the B stage. Therefore, the execution path information PINFj indicates the process Ba. In addition, since the logic circuit 242 is rewritten to the logic circuit 242Ba, the execution path information PINFi indicates the process Ba. Accordingly, the execution path information PINFj matches the execution path information PINFi. Since the process A11 is the last process A to be input to the A stage, the process A is not input to the A stage after the process cycle CYC16.

In the B stage of the process cycle CYC15, the input control circuit 222 causes the current logic circuit 242Ba (the rewritten logic circuit 242Ba) written in the reconfigurable circuit 204 to execute the process Ba8 waiting for execution. For example, the input control circuit 222 transfers the process data PDT having the order information NINF "8" among the plural process data PDT held in the standby buffer circuit 232 to the current logic circuit 242Ba, and causes the current logic circuit 242Ba to execute the process Ba8 waiting for execution. The process data PDT having the order information NINF "8" is the process data PDT with the earliest reception order among the process data PDT corresponding to the execution path information PINFw matching the execution path information PINFi (process Ba).

In the C stage of the process cycle CYC15, the logic circuit 272 executes the process C7 by using the result data RDT corresponding to the order information NINF matching the output number CT ("7") among the result data RDT held in the output buffer circuit 260.

In the B stage of the process cycle CYC16, the input control circuit 222 causes the current logic circuit 242Ba to execute the process Ba9 waiting for execution. Therefore, in the process cycle CYC16, the input control circuit 222 stores, for example, the execution path information PINF indicating the process Ba11 determined by the process determination circuit 212 in the process cycle CYC15 in the standby buffer circuit 232. In the C stage of the process cycle CYC16, the logic circuit 272 executes the process C8 by using the result of the process Ba8 executed in the process cycle CYC15.

In the B stage of the process cycle CYC17, the input control circuit 222 causes the current logic circuit 242Ba to execute the process Ba10 waiting for execution. In the C stage of the process cycle CYC17, the logic circuit 272 executes the process C9 by using the result of the process Ba9 executed in the process cycle CYC16.

In the B stage of the process cycle CYC18, the input control circuit 222 causes the current logic circuit 242Ba to execute the process Ba11 waiting for execution. According to this, the standby buffer circuit 232 enters an empty state in which no process data PDT or the like is held. In the C stage of the process cycle CYC17, the logic circuit 272 executes the process C10 by using the result of the process Ba10 executed in the process cycle CYC17.

In the C stage of the process cycle CYC19, the logic circuit 270 executes the process C11 by using the result of the process Ba11 executed in the process cycle CYC18. According to this, the series of processes input to the pipeline is ended.

In this way, in the information processing apparatus 14, the logic circuit 272 at the next stage of the logic circuit 242 reconfigured by the dynamic reconfiguration can execute the process C in the order of being input to the pipeline.

Figure 13:
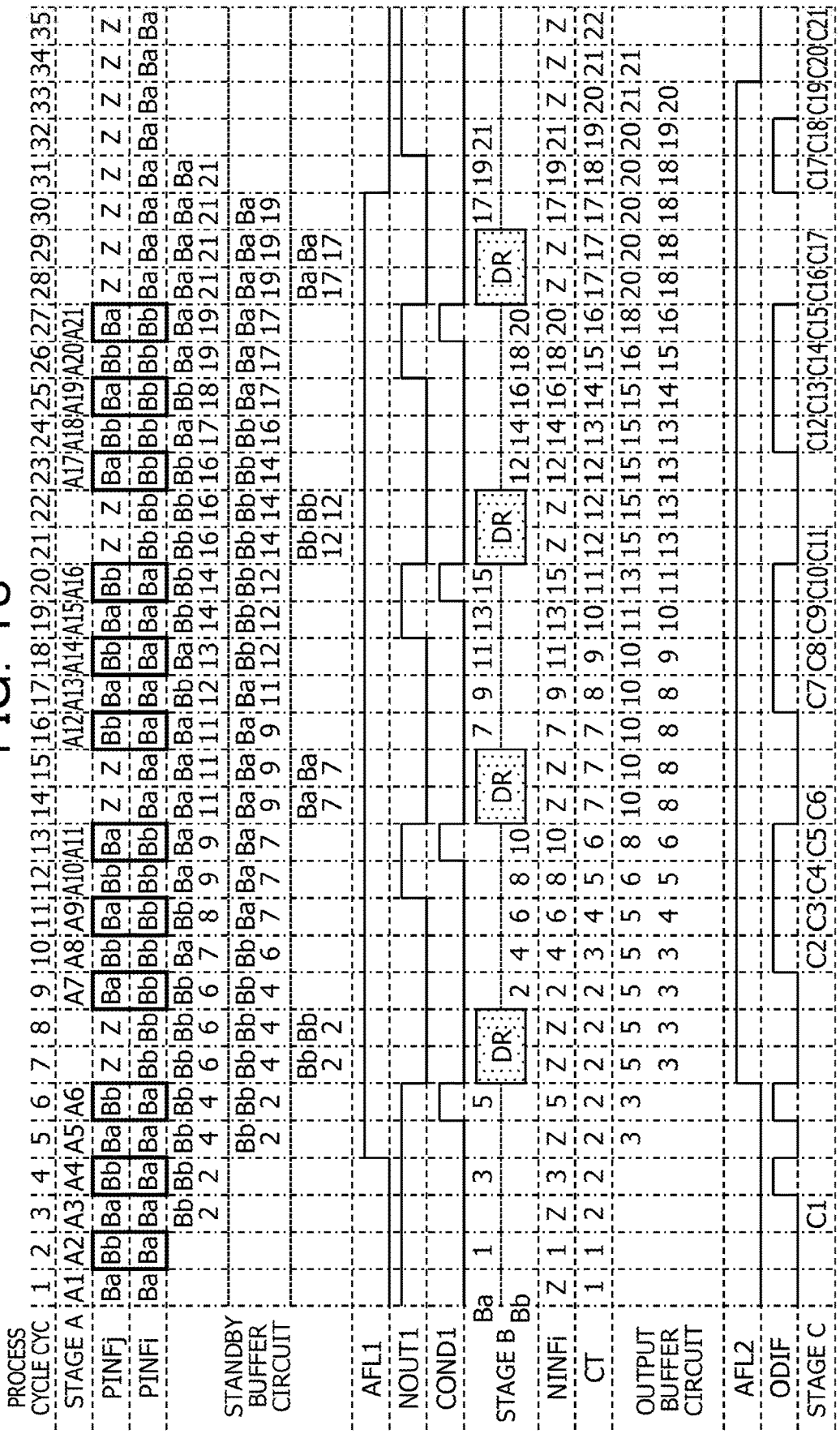
FIG. 13 is a view illustrating another example of the operation of the information processing apparatus illustrated in FIG. 9.

FIG. 13 illustrates another example of the operation of the information processing apparatus 14 illustrated in FIG. 9. In FIG. 13, in order to make the figure easy to see, the information COND2, COND3 and NOUT2 and the storage request BUFIN described in FIG. 12 are omitted. In addition, the process B executed in the B stage illustrated in FIG. 13 is divided into a process Ba field and a process Bb field which are described by numerals corresponding to the processes A and C (numerals indicating the input order to the pipeline).

In the operation illustrated in FIG. 13, the process A whose branch destination is the process Ba (the process A with an odd number added to the tail of symbol) and the process A whose branch destination is the process Bb (the process A with an even number added to the tail of symbol) are alternately input to the pipeline. Therefore, in the process cycle CYC5, the number of process data PDT held in the standby buffer circuit 232 reaches the first decision value ("2") and the almost full information AFL1 changes from logic 0 to logic 1. In addition, the first decision value, the second decision value and the current logic circuit 242 in the process cycle CYC1 are the same as those in FIG. 12. In the process cycle CYC5, since the execution path information PINFj (process Ba) matches the execution path information PINFi (process Ba), the information COND1 is maintained at logic 0.

In the process cycle CYC6, the execution path information PINFj (process Bb) and the execution path information PINFi (process Ba) are different from each other. In addition, the almost full information AFL1 and the information NOUT1 are logic 1. Therefore, the information COND1 changes from logic 0 to logic 1. According to this, in the next process cycle CYC7, the rewriting DR of the current logic circuit 242 Ba is started.

In the operation illustrated in FIG. 13, before the number of result data RDT held in the output buffer circuit 260 exceeds the second decision value ("2"), the number of process data PDT held in the standby buffer circuit 232 exceeds the first decision value ("2"). Therefore, in the operation illustrated in FIG. 13, the rewriting DR of the logic circuit 242 due to exceeding of the number of result data RDT held in the output buffer circuit 260 over the second decision value ("2") does not occur.

After the logic circuit 242 is rewritten to the logic circuit 242Bb, processes are executed in order from the process Bb waiting for execution. Then, in the process cycle CYC14, the number of process data PDT held in the standby buffer circuit 232 exceeds the first decision value ("2"). Therefore, in the process cycle CYC14, the rewriting DR of the current logic circuit 242Bb is started. Thereafter, each time the process B is executed five times by the current logic circuit 242, the rewriting DR of the current logic circuit 242 is executed. Then, in the B stage of the process cycle CYC32, the last process Ba21 is executed. In the C stage of the process cycle CYC35, the last process C21 using the result of the process Ba21 is executed and then the series of processes is ended.

In this manner, in the operation illustrated in FIG. 13, when the logic circuit 272 executes the process C in the order of being input to the pipeline, the rewriting DR of the logic circuit 242 is executed four times until the process C21 corresponding to the last process A21 is ended after the first process A1 is executed. In contrast, in the conventional information processing apparatus described with reference to FIG. 2, since the process B is executed in the order of being input to the pipeline, the rewriting DR of the logic circuit 242 occurs from the process Ba1 to the process Ba21 each time the process B is ended. That is, in the conventional information processing apparatus, when the logic circuit 272 executes the process C in the order of being input to the pipeline, the rewriting DR of the logic circuit 242 is executed 20 times until the process C21 corresponding to the last process A21 is ended after the first process A1 is executed.

In the information processing apparatus 14, even when the logic circuit 272 at the next stage of the logic circuit 242 reconfigured by dynamic reconfiguration executes the process C in the order of being input to the pipeline, it is possible to suppress an increase in the number of times of dynamic reconfiguration when the plural processes Ba and Bb are executed, as compared with the conventional information processing apparatus. As a result, the information processing apparatus 14 can suppress an increase in the number of process cycles CYC required to execute the plural processes B, as compared with the conventional information processing apparatus.

As described above, even in the embodiment illustrated in FIGS. 9 to 13, it is possible to achieve the same effects as the embodiment illustrated in FIGS. 4 to 8. For example, it is possible to reduce the number of times of rewriting of the logic circuit 242, as compared with a case where the logic circuit 242 is rewritten each time the process B which cannot be executed in the current logic circuit 242 is determined as the process B to be executed in the B stage. That is, it is possible to suppress an increase in the number of times of dynamic reconfiguration when the plurality processes B are executed by the reconfigurable circuit 204 capable of rewriting a logic circuit.

Thus, it is possible to improve the performance of the information processing apparatus 14. In particular, when the time required for rewriting of the logic circuit 242 is longer than the time for which the logic circuit 242 executes the process B, the effect of improving the performance of the information processing apparatus 14 by reducing the number of times of rewriting of the logic circuit 242 is growing.

The output control circuit 250 transfers the result data RDT as the result of the process B executed by the current logic circuit 242 to the logic circuit 272 at the next stage in the order indicated by the order information NINF corresponding to the executed process B. Further, when the amount of result data RDT held in the output buffer circuit 260 exceeds the second predetermined amount, the rewrite control circuit 302 rewrites the current logic circuit 242 to the logic circuit 242 that executes the process B waiting for execution corresponding to the order information NINF indicating the same order as the output number CT. According to this, even when the logic circuit 272 at the next stage of the logic circuit 242 reconfigured by dynamic reconfiguration executes the process C in the order of being input to the pipeline, it is possible to suppress an increase in the number of times of dynamic reconfiguration when the plural processes B are executed, as compared with the conventional case.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An information processing apparatus having a reconfigurable circuit capable of rewriting a logic circuit, comprising:
   a process determination circuit configured to determine which of a plurality of processes is to be executed;
   a standby buffer circuit configured to hold process data to be used in a process which waits for execution among processes determined by the process determination circuit;
   an input control circuit configured to determine whether a logic circuit which executes the process determined by the process determination circuit is written in the reconfigurable circuit, configured to store new process data received from the process determination circuit in the standby buffer circuit when determining that the logic circuit which executes the process determined by the process determination circuit is not written in the reconfigurable circuit and configured to keep the process determined by the process determination circuit standby as the process which waits for execution;
   a rewrite control circuit configured to compare an amount of process data held in the standby buffer circuit with a first predetermined amount when determining that the logic circuit which executes the process determined by the process determination circuit is not written in the reconfigurable circuit and configured to rewrite the current logic circuit written in the reconfigurable circuit to a logic circuit that executes one of the plurality of processes which wait for execution using each of a plurality of process data held in the standby buffer circuit when the amount of process data held in the standby buffer circuit exceeds a first predetermined amount;
   a selection circuit configured to select whether to rewrite the current logic circuit to the logic circuit which executes any of the plurality of processes when the rewrite control circuit rewrites the current logic circuit, wherein the input control circuit stores order information indicating a reception order of the process data received from the process determination circuit in the standby buffer circuit in association with the process data, the selection circuit selects a process with the earliest reception order among the plurality of processes which wait for execution based on the order information, and the rewrite control circuit rewrites the current logic circuit to a logic circuit that executes the process selected by the selection circuit when the amount of process data held in the standby buffer circuit exceeds the first predetermined amount; and
   an output control circuit configured to transfer result data as a result of the process executed in the current logic circuit to a next stage in an order indicated by the order information corresponding to the executed process, wherein the input control circuit transfers the order information corresponding to the process executed in the current logic circuit to the output control circuit.

2. The information processing apparatus according to claim 1, further comprising:
a first decision circuit configured to decide that the amount of process data held in the standby buffer circuit exceeds the first predetermined amount when the number of process data held in the standby buffer circuit is equal to or larger than a predetermined first decision value, the logic circuit which executes the process determined by the process determination circuit is different from the current logic circuit, and none of the processes which wait for execution can be executed in the current logic circuit, wherein the rewrite control circuit executes rewriting of the current logic circuit based on a result of the decision by the first decision circuit.

3. The information processing apparatus according to claim 1, wherein, when there is a process which waits for execution that can be executed in the current logic circuit, the input control circuit keeps the process determined by the process determination circuit standby as the process which waits for execution and causes the current logic circuit to execute the process which waits for execution that can be executed in the current logic circuit.

4. The information processing apparatus according to claim 1, further comprising:
an output counter configured to increment an output number each time the result data is transferred to the next stage; and
an output buffer circuit configured to hold the result data which waits for transfer to the next stage in association with the order information,
wherein, when the reception order indicated by the order information received from the input control circuit is different from the output number indicated by the output counter, the output control circuit stores the result data received from the current logic circuit in the output buffer circuit in association with the order information received from the input control circuit, and
wherein, when the amount of result data held in the output buffer circuit exceeds a second predetermined amount, the rewrite control circuit rewrites the current logic circuit to the logic circuit that executes the process which waits for execution corresponding to the order information indicating the same order as the output number indicated by the output counter.

5. The information processing apparatus according to claim 4, further comprising:
a second decision circuit configured to decide that the amount of result data held in the output buffer circuit exceeds the second predetermined amount when the number of result data held in the output buffer circuit is equal to or larger than a predetermined second decision value and the output number indicated by the output counter matches none of reception orders indicated by the order information held in the output buffer circuit and the order information received from the input control circuit.

6. The information processing apparatus according to claim 1, wherein the process determination circuit outputs execution path information indicating a process to be executed and process data to the input control circuit, wherein, when keeping the process determined by the process determination circuit standby as the process which waits for execution, the input control circuit stores the execution path information in the standby buffer circuit in association with the process data.

7. An information processing system having an information processing apparatus including a reconfigurable circuit capable of dynamically rewriting a logic circuit, and executing an operation using the information processing apparatus, the information processing apparatus comprising:
a process determination circuit configured to determine which of a plurality of processes is to be executed;
a standby buffer circuit configured to hold process data to be used in a process which waits for execution among processes determined by the process determination circuit;
an input control circuit configured to determine whether a logic circuit which executes the process determined by the process determination circuit is written in the reconfigurable circuit, configured to store new process data received from the process determination circuit in the standby buffer circuit when determining that the logic circuit which executes the process determined by the process determination circuit is not written in the reconfigurable circuit and configured to keep the process determined by the process determination circuit standby as the process which waits for execution;
a rewrite control circuit configured to compare an amount of process data held in the standby buffer circuit with a first predetermined amount when determining that the logic circuit which executes the process determined by the process determination circuit is not written in the reconfigurable circuit and configured to rewrite the current logic circuit written in the reconfigurable circuit to a logic circuit that executes one of the plurality of processes which wait for execution using each of a plurality of process data held in the standby buffer circuit when the amount of process data held in the standby buffer circuit exceeds a first predetermined amount;
a selection circuit configured to select whether to rewrite the current logic circuit to the logic circuit which executes any of the plurality of processes when the rewrite control circuit rewrites the current logic circuit, wherein the input control circuit stores order information indicating a reception order of the process data received from the process determination circuit in the standby buffer circuit in association with the process data, the selection circuit selects a process with the earliest reception order among the plurality of processes which wait for execution based on the order information, and the rewrite control circuit rewrites the current logic circuit to a logic circuit that executes the process selected by the selection circuit when the amount of process data held in the standby buffer circuit exceeds the first predetermined amount; and
an output control circuit configured to transfer result data as a result of the process executed in the current logic circuit to a next stage in an order indicated by the order information corresponding to the executed process,
wherein the input control circuit transfers the order information corresponding to the process executed in the current logic circuit to the output control circuit.

8. An information processing method for an information processing apparatus having a reconfigurable circuit capable of rewriting a logic circuit, the method comprising:
determining, by a process determination circuit in the information processing apparatus, which of a plurality of processes is to be executed;

holding, by a standby buffer circuit in the information processing apparatus, process data to be used in a process which waits for execution among processes determined by the process determination circuit;

determining, by an input control circuit in the information processing apparatus, whether a logic circuit which executes the process determined by the process determination circuit is written in the reconfigurable circuit;

storing, by the input control circuit, new process data received from the process determination circuit in the standby buffer circuit when determining that the logic circuit which executes the process determined by the process determination circuit is not written in the reconfigurable circuit and keeping the process determined by the process determination circuit standby as the process which waits for execution;

comparing, by a rewrite control circuit in the information processing apparatus, an amount of process data held in the standby buffer circuit with a first predetermined amount when determining that the logic circuit which executes the process determined by the process determination circuit is not written in the reconfigurable circuit;

rewriting, by the rewrite control circuit, the current logic circuit written in the reconfigurable circuit to a logic circuit that executes one of the plurality of processes which wait for execution using each of a plurality of process data held in the standby buffer circuit when the amount of process data held in the standby buffer circuit exceeds a first predetermined amount;

selecting, by a selection circuit, whether to rewrite the current logic circuit to the logic circuit which executes any of the plurality of processes when the rewrite control circuit rewrites the current logic circuit;

storing, by the input control circuit, order information indicating a reception order of the process data received from the process determination circuit in the standby buffer circuit in association with the process data;

selecting, by the selection circuit, a process with the earliest reception order among the plurality of processes which wait for execution based on the order information;

rewriting, by the rewrite control circuit, the current logic circuit to a logic circuit that executes the process selected by the selection circuit when the amount of process data held in the standby buffer circuit exceeds the first predetermined amount;

transferring, by an output control circuit, result data as a result of the process executed in the current logic circuit to a next stage in an order indicated by the order information corresponding to the executed process; and transferring, by the input control circuit, the order information corresponding to the process executed in the current logic circuit to the output control circuit.

9. A non-transitory computer-readable recording medium storing a program that causes an information processing apparatus having a reconfigurable circuit capable of rewriting a logic circuit to execute a process, the process comprising:

determining, by a process determination circuit in the information processing apparatus, which of a plurality of processes is to be executed;

holding, by a standby buffer circuit in the information processing apparatus, process data to be used in a process which waits for execution among processes determined by the process determination circuit;

determining, by an input control circuit in the information processing apparatus, whether a logic circuit which executes the process determined by the process determination circuit is written in the reconfigurable circuit;

storing, by the input control circuit, new process data received from the process determination circuit in the standby buffer circuit when determining that the logic circuit which executes the process determined by the process determination circuit is not written in the reconfigurable circuit and keeping the process determined by the process determination circuit standby as the process which waits for execution;

comparing, by a rewrite control circuit in the information processing apparatus, an amount of process data held in the standby buffer circuit with a first predetermined amount when determining that the logic circuit which executes the process determined by the process determination circuit is not written in the reconfigurable circuit;

rewriting the current logic circuit written in the reconfigurable circuit to a logic circuit that executes one of the plurality of processes which wait for execution using each of a plurality of process data held in the standby buffer circuit when the amount of process data held in the standby buffer circuit exceeds a first predetermined amount;

selecting, by a selection circuit, whether to rewrite the current logic circuit to the logic circuit which executes any of the plurality of processes when the rewrite control circuit rewrites the current logic circuit;

storing, by the input control circuit, order information indicating a reception order of the process data received from the process determination circuit in the standby buffer circuit in association with the process data;

selecting, by the selection circuit, a process with the earliest reception order among the plurality of processes which wait for execution based on the order information;

rewriting, by the rewrite control circuit, the current logic circuit to a logic circuit that executes the process selected by the selection circuit when the amount of process data held in the standby buffer circuit exceeds the first predetermined amount;

transferring, by an output control circuit, result data as a result of the process executed in the current logic circuit to a next stage in an order indicated by the order information corresponding to the executed process; and transferring, by the input control circuit, the order information corresponding to the process executed in the current logic circuit to the output control circuit.

* * * * *